(12) United States Patent  
Kuriki

(10) Patent No.: US 9,280,185 B2  
(45) Date of Patent: Mar. 8, 2016

(54) CONDUCTIVE SHEET AND TOUCH PANEL

(71) Applicant: FUJIFILM Corporation, Tokyo (JP)

(72) Inventor: Tadashi Kuriki, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 118 days.

(21) Appl. No.: 14/077,859

(22) Filed: Nov. 12, 2013

(65) Prior Publication Data

US 2014/0063374 A1  Mar. 6, 2014

Related U.S. Application Data

(63) Continuation of application No. PCT/JP2012/062120, filed on May 11, 2012.

(30) Foreign Application Priority Data

May 13, 2011  (JP) ................. 2011-108295

(51) Int. Cl.
G06F 3/041 (2006.01)
G06F 1/16 (2006.01)
G06F 3/044 (2006.01)
H05K 1/02 (2006.01)

(52) U.S. Cl.
CPC .............. *G06F 1/1692* (2013.01); *G06F 3/044* (2013.01); *H05K 1/0274* (2013.01); *G06F 2203/04103* (2013.01); *G06F 2203/04107* (2013.01); *G06F 2203/04112* (2013.01)

(58) Field of Classification Search
CPC ................... G06F 3/044; G06F 2203/04112
See application file for complete search history.

(56) References Cited

U.S. PATENT DOCUMENTS

| 7,202,859 | B1 | 4/2007 | Speck et al. |
| 2003/0052867 | A1 | 3/2003 | Shigetaka et al. |
| 2004/0229028 | A1 | 11/2004 | Sasaki et al. |
| 2004/0239650 | A1 | 12/2004 | MacKey |
| 2008/0211371 | A1 | 9/2008 | Sasaki et al. |

(Continued)

FOREIGN PATENT DOCUMENTS

| JP | 5-224818 A | 9/1993 |
| JP | 2003-99185 A | 4/2003 |

(Continued)

OTHER PUBLICATIONS

Japanese Office Action, dated Feb. 17, 2015, in related application No. JP2011-108295.

(Continued)

*Primary Examiner* — Thanh-Nhan P Nguyen  
(74) *Attorney, Agent, or Firm* — Birch, Stewart, Kolasch & Birch, LLP

(57) ABSTRACT

The present invention pertains to a conductive sheet and a touch panel. A first conductive pattern and a second conductive pattern are both configured from the combination of a plurality of first lattices and a plurality of second lattices having a size that is larger than that of the first lattices. Of the first conductive pattern, the portion facing the second conductive pattern is configured from a plurality of second lattices, of the second conductive pattern, the portion facing the first conductive pattern is configured from a plurality of second lattices, and when seen from the top surface, the portions at which the first conductive pattern and the second conductive pattern are facing have a form that combines a plurality of first lattices.

36 Claims, 12 Drawing Sheets

(56) References Cited

U.S. PATENT DOCUMENTS

| | | | |
|---|---|---|---|
| 2009/0218310 A1* | 9/2009 | Zu et al. ........................... | 216/11 |
| 2010/0045615 A1 | 2/2010 | Gray et al. | |
| 2010/0302204 A1 | 12/2010 | Miyayama et al. | |
| 2011/0102370 A1 | 5/2011 | Kono et al. | |
| 2011/0310033 A1* | 12/2011 | Liu et al. ........................ | 345/173 |
| 2014/0060909 A1 | 3/2014 | Ullmann et al. | |

FOREIGN PATENT DOCUMENTS

| | | |
|---|---|---|
| JP | 2010-089537 A | 2/2010 |
| JP | 2011-175412 A | 9/2011 |
| WO | WO 95/27334 A1 | 10/1995 |
| WO | WO 97/18508 A1 | 5/1997 |
| WO | WO 2005/121940 A2 | 12/2005 |
| WO | WO 2006/001461 A1 | 1/2006 |
| WO | WO 2012/126996 A2 | 9/2012 |

OTHER PUBLICATIONS

International Search Report, issued in PCT/JP2012/062120, dated Jul. 17, 2012.
Written Opinion of the International Search Authority, issued in PCT/JP2012/062120, dated Jul. 17, 2012.
Extended European Search Report issued in European Patent Application No. 12785474.3 on Feb. 2, 2015.
Chinese Office Action with Search Report, dated Oct. 30, 2015, in corresponding Chinese Application No. 201280022915.1 with partial English translation.

* cited by examiner

CONDUCTIVE SHEET AND TOUCH PANEL

CROSS-REFERENCE TO RELATED APPLICATIONS AND PRIORITY CLAIM

This application is a Continuation of International Application No. PCT/JP2012/062120 filed on May 11, 2012, which was published under PCT Article 21(2) in Japanese, which is based upon and claims the benefit of priority from Japanese Patent Application No. 2011-108295 filed on May 13, 2011, the contents all of which are incorporated herein by reference.

TECHNICAL FIELD

The present invention relates to a conductive sheet and a touch panel, for example suitable for use in a projected capacitive touch panel.

BACKGROUND ART

Transparent conductive sheets containing thin metal wires have been studied as disclosed in U.S. Patent Application Publication No. 2004/0229028, International Publication No. WO 2006/001461, etc.

Touch panels have attracted much attention in recent years. The touch panel has currently been used mainly in small devices such as PDAs (personal digital assistants) and mobile phones, and is expected to be used in large devices such as personal computer displays.

A conventional electrode for the touch panel is composed of ITO (indium tin oxide) and therefore has a high resistance. Thus, when the conventional electrode is used in the large device in the above future trend, the large-sized touch panel has a low current transfer rate between the electrodes, and thereby exhibits a low response speed (a long time between finger contact and touch position detection).

A large number of lattices made of thin wires of a metal (thin metal wires) can be arranged to form an electrode with a lowered surface resistance. Touch panels using the electrode of the thin metal wires are known from Japanese Laid-Open Patent Publication No. 05-224818, International Publication No. WO 1995/27334, U.S. Patent Application Publication No. 2004/0239650, U.S. Pat. No. 7,202,859, International Publication No. WO 1997/18508, Japanese Laid-Open Patent Publication No. 2003-099185, International Publication No. WO 2005/121940, etc.

SUMMARY OF INVENTION

The touch panel electrode of the thin metal wires has problems with transparency and visibility because the thin metal wires are composed of an opaque material as described in the above documents such as Japanese Laid-Open Patent Publication No. 05-224818.

In view of the above problems, an object of the present invention is to provide a conductive sheet and a touch panel, which can have an electrode containing a pattern of less-visible thin metal wires, a high transparency, a high visibility, and improved detection sensitivity.

[1] A conductive sheet according to a first aspect of the present invention comprises a plurality of conductive patterns arranged in one direction. The conductive patterns each contain a combination of a plurality of first lattices and a plurality of second lattices, the first and second lattices are composed of thin metal wires, and the second lattices are larger than the first lattices. Second lattice portions containing the second lattices are arranged in the one direction, first lattice portions containing the first lattices are arranged at predetermined intervals in a direction approximately perpendicular to the one direction, and the first lattice portions are not connected with the second lattice portions.

Since the conductive patterns each contain a combination of the first lattices and the larger second lattices composed of the thin metal wires, the conductive sheet can have the electrodes containing the patterns of less visible thin metal wires, a high transparency, and a high visibility. Furthermore, for example, the second lattice portion can be used as a connection for connecting the electrodes, and the first lattices can be used as a dummy pattern. Thus, the conductive sheet can be adapted to a variety of uses (e.g. in a touch panel).

[2] In the first aspect, the first lattice portions may each contain two or more first lattices arranged in the one direction.

[3] In the first aspect, the first lattice portions may each contain an L-shaped pattern containing a corner of the first lattice.

[4] In the first aspect, the first lattice portions may each contain a cross-shaped pattern containing a corner of the first lattice.

[5] A conductive sheet according to a second aspect of the present invention comprises a plurality of conductive patterns arranged in one direction. The conductive patterns each contain a combination of a plurality of first lattices and a plurality of second lattices, the first and second lattices are composed of thin metal wires, and the second lattices are larger than the first lattices. First lattice portions containing the first lattices and second lattice portions containing the second lattices are electrically connected and alternately arranged in a direction approximately perpendicular to the one direction. A length of the first lattice portion is approximately equal to a length of the second lattice portion in the one direction.

Since the conductive patterns each contain a combination of the first lattices and the larger second lattices composed of the thin metal wires, the conductive sheet having the electrodes containing the patterns of the thin metal wires can exhibit a high transparency and a high visibility. Furthermore, the first lattice portion can be used as an electrode, and the second lattice portion can be used as a connection. In addition, since the length of the first lattice portion is approximately equal to the length of the second lattice portion in the one direction, the conductive sheet can have an excellent conductivity and improved detection sensitivity.

[6] In the second aspect, the length L1 of the first lattice portion and the length L2 of the second lattice portion in the direction approximately perpendicular to the one direction may satisfy the inequality of L1<L2. For example, in a mutual capacitance technology, the first lattice portion can be used as a receiving electrode with a high receiving sensitivity.

[7] In this case, it is preferred that the lengths L1 and L2 satisfy the inequality of $1.5 \times L1 \leq L2 \leq 6 \times L1$.

[8] In the second aspect, the length L1 of the first lattice portion and the length L2 of the second lattice portion in the direction approximately perpendicular to the one direction may satisfy the inequality of L1>L2. For example, in a mutual capacitance technology, the second lattice portion can be used as a drive electrode with high detection sensitivity.

[9] In this case, it is preferred that the lengths L1 and L2 satisfy the inequality of $1.5 \times L2 \leq L1 \leq 6 \times L2$.

[10] A conductive sheet according to a third aspect of the present invention comprises a first conductive part and a second conductive part overlapping with each other. The first conductive part contains a plurality of first conductive patterns arranged in one direction. The second conductive part contains a plurality of second conductive patterns arranged in another direction perpendicular to the one arrangement direction of the first conductive patterns. The first and second conductive patterns each contain a combination of a plurality of first lattices and a plurality of second lattices, the first and second lattices are composed of thin metal wires, and the second lattices are larger than the first lattices. In the first conductive patterns, portions overlapping with the second conductive patterns each contain a plurality of the second lattices, and portions not overlapping with the second conductive patterns each contain a plurality of the first lattices. In the second conductive patterns, portions overlapping with the first conductive patterns each contain a plurality of the second lattices, and portions not overlapping with the first conductive patterns each contain a plurality of the first lattices. As viewed from above, the overlaps of the first and second conductive patterns each contain a combination of a plurality of the first lattices.

The first and second conductive patterns each contain a combination of a plurality of the first lattices and a plurality of the second lattices. In the first conductive patterns, the portions overlapping with the second conductive patterns each contain a plurality of the second lattices, and the portions not overlapping with the second conductive patterns each contain a plurality of the first lattices. In the second conductive patterns, the portions overlapping with the first conductive patterns each contain a plurality of the second lattices, and the portions not overlapping with the first conductive patterns each contain a plurality of the first lattices. As viewed from above, the overlaps of the first and second conductive patterns each contain a combination of a plurality of the first lattices. Therefore, the entire surface is covered with the first lattices. Thus, the boundaries between the first and second conductive patterns can hardly be found. Consequently, when the patterns of the thin metal wires are used as electrodes in a touch panel, the thin metal wires can be less visible, and the visibility can be improved.

[11] In the third aspect, the first and second conductive patterns may each have a strip shape, and the maximum width of the second conductive pattern may be larger than that of the first conductive pattern. In this case, the occupation area of the second conductive patterns can be increased, and the surface resistance of the second conductive patterns can be lowered to reduce a noise impact of an electromagnetic wave.

[12] In this case, it is preferred that the ratio (Wb/Wa) of the maximum width Wb of the second conductive pattern to the maximum width Wa of the first conductive pattern satisfies the condition of $1<Wb/Wa \leq 10$.

[13] It is further preferred that the ratio (Wb/Wa) satisfies the condition of $2 \leq Wb/Wa \leq 8$.

[14] It is particularly preferred that the ratio (Wb/Wa) satisfies the condition of $3 \leq Wb/Wa \leq 5$.

[15] In the third aspect, an occupation area of the second conductive patterns may be larger than that of the first conductive patterns. In this case, the surface resistance of the second conductive patterns can be lowered to reduce a noise impact of an electromagnetic wave.

[16] In this case, it is preferred that, when the first conductive patterns have an occupation area A1 and the second conductive patterns have an occupation area A2, the conductive sheet satisfies the condition of $1<A2/A1 \leq 20$.

[17] It is further preferred that the conductive sheet satisfies the condition of $1<A2/A1 \leq 10$.

[18] It is particularly preferred that the conductive sheet satisfies the condition of $2 \leq A2/A1 \leq 10$.

[19] In the third aspect, in the first conductive patterns, the portions containing a plurality of the first lattices may act as first electrodes. In the second conductive patterns, the portions containing a plurality of the first lattices may act as second electrodes. As viewed from above, the first electrodes, the second electrodes, and the overlaps of the first and second conductive patterns may form a uniform lattice pattern. In this case, the boundaries between the first and second electrodes can hardly be found, and the visibility can be improved.

[20] In the third aspect, the first conductive part may contain first auxiliary patterns between adjacent first conductive patterns, the first auxiliary patterns being not connected to the first conductive patterns. The second conductive part may contain second auxiliary patterns between adjacent second conductive patterns, the second auxiliary patterns being not connected to the second conductive patterns. As viewed from above, the first and second auxiliary patterns may overlap with each other to form combined patterns, and the combined patterns may each contain a combination of a plurality of the first lattices. In this case, the boundaries between the first and second electrodes can hardly be found, and the visibility can be improved.

[21] In the first to third aspects, it is preferred that the first lattices have a side length of 30 to 500 µm.

[22] Furthermore, it is preferred that the thin metal wires have a line width of 15 µm or less. In this case, when the patterns of the thin metal wires are used as electrodes in a touch panel, the conductive sheet can have a high transparency, a high visibility, and improved detection sensitivity.

[23] Furthermore, it is preferred that the first and second conductive parts are stacked with a substrate interposed therebetween, and the substrate has a thickness of 50 to 350 µm. In this case, the detection sensitivity and the visibility can be improved.

[24] In the first to third aspects, a side length of the second lattice may be a real-number multiple of a side length of the first lattice.

[25] In this case, the side length of the second lattice may be twice as large as the side length of the first lattice.

[26] A touch panel according to a fourth aspect of the present invention comprises a conductive sheet, which is used on a display panel of a display device. The conductive sheet contains a plurality of conductive patterns arranged in one direction. The conductive patterns each contain a combination of a plurality of first lattices and a plurality of second lattices, the first and second lattices are composed of thin metal wires, and the second lattices are larger than the first lattices. Second lattice portions containing the second lattices are arranged in the one direction. First lattice portions containing the first lattices are arranged at predetermined intervals in a direction approximately perpendicular to the one direction. The first lattice portions are not connected with the second lattice portions.

[27] A touch panel according to a fifth aspect of the present invention comprises a conductive sheet, which is used on a display panel of a display device. The conductive sheet contains a plurality of conductive patterns arranged in one direction. The conductive patterns each contain a combination of a plurality of first lattices and a plurality of second lattices, the first and second lattices are composed of thin metal wires, and the second lattices are larger than the first lattices. First lattice portions containing the first lattices and second lattice portions containing the second lattices are electrically connected and alternately arranged in a direction approximately perpendicular to the one direction. A length of the first lattice portion is approximately equal to a length of the second lattice portion in the one direction.

[28] A touch panel according to a sixth aspect of the present invention comprises a conductive sheet, which is used on a display panel of a display device. The conductive sheet contains a first conductive part disposed closer to an input operation surface and a second conductive part disposed closer to the display panel. The first and second conductive parts overlap with each other. The first conductive part contains a plurality of first conductive patterns arranged in one direction. The second conductive part contains a plurality of second conductive patterns arranged in another direction perpendicular to the one arrangement direction of the first conductive patterns. The first and second conductive patterns each contain a combination of a plurality of first lattices and a plurality of second lattices, the first and second lattices are composed of thin metal wires, and the second lattices are larger than the first lattices. In the first conductive patterns, portions overlapping with the second conductive patterns each contain a plurality of the second lattices, and portions not overlapping with the second conductive patterns each contain a plurality of the first lattices. In the second conductive patterns, portions overlapping with the first conductive patterns each contain a plurality of the second lattices, and portions not overlapping with the first conductive patterns each contain a plurality of the first lattices. As viewed from above, the overlaps of the first and second conductive patterns each contain a combination of a plurality of the first lattices.

As described above, the conductive sheet and the touch panel of the present invention can have the electrodes containing the patterns of less visible thin metal wires, a high transparency, a high visibility, and an improved detection sensitivity.

DESCRIPTION OF EMBODIMENTS

Figure 1:
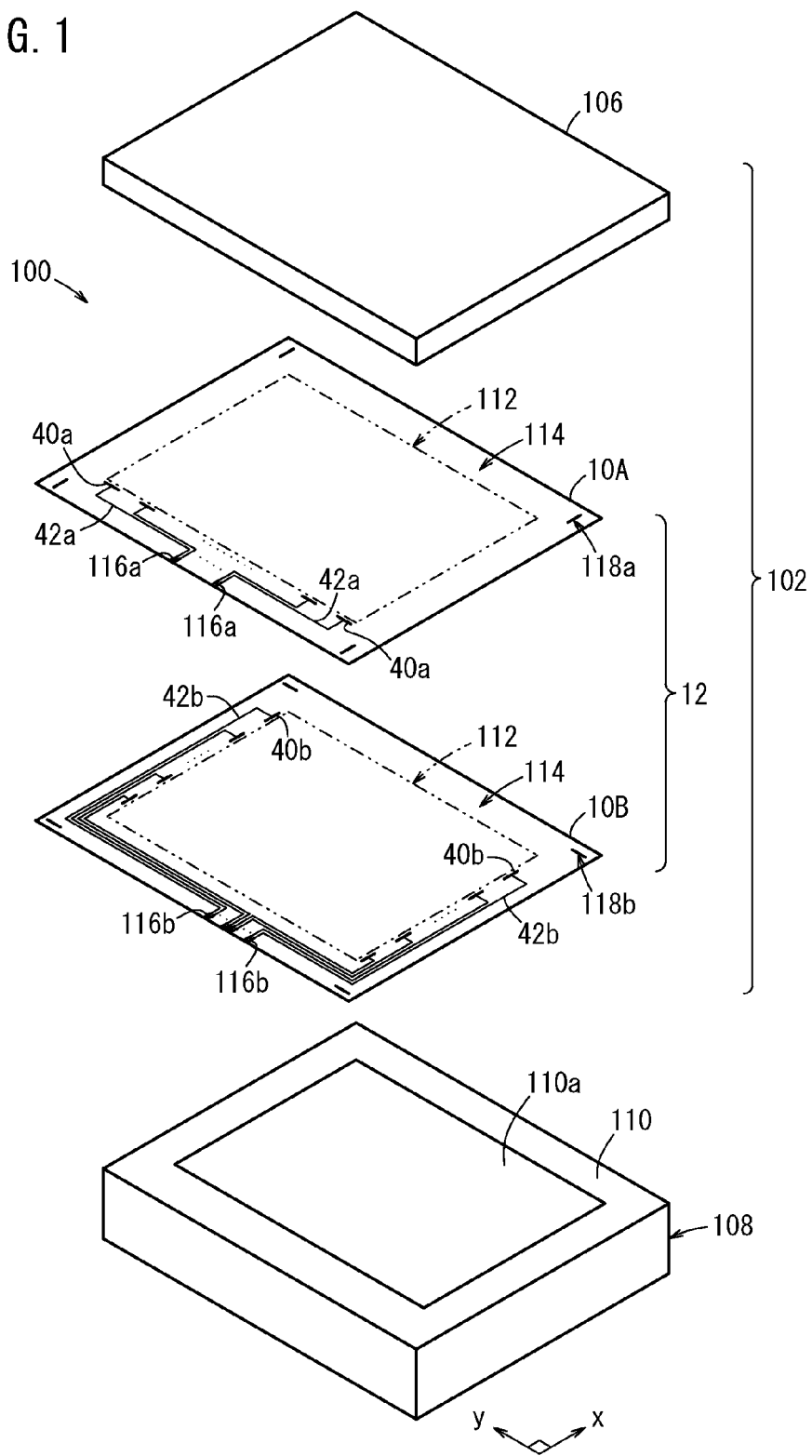
FIG. 1 is an exploded perspective view of a touch panel according to an embodiment of the present invention.

Several embodiments of the conductive sheet and the touch panel of the present invention will be described below with reference to FIGS. 1 to 12. It should be noted that, in this description, a numeric range of "A to B" includes both the numeric values A and B as the lower limit and upper limit values.

A touch panel 100 having a conductive sheet according to an embodiment of the present invention will be described below with reference to FIG. 1.

The touch panel 100 has a sensor body 102 and a control circuit such as an integrated circuit (not shown). The sensor body 102 contains a conductive sheet stack 12 according to this embodiment and thereon a protective layer 106. The conductive sheet stack 12 and the protective layer 106 can be disposed on a display panel 110 of a display device 108 such as a liquid crystal display. As viewed from above, the sensor body 102 has a touch position sensing region 112 corresponding to a display screen 110a of the display panel 110 and a terminal wiring region 114 (a so-called frame) corresponding to the periphery of the display panel 110.

Figure 2:
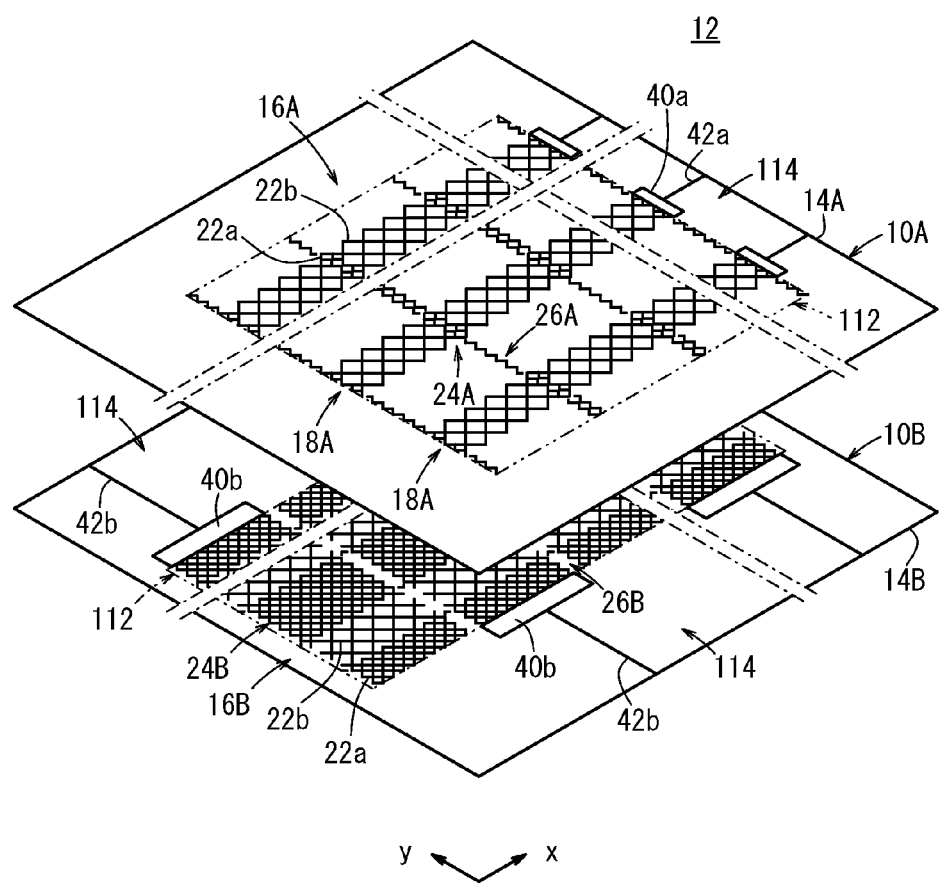
FIG. 2 is a partially-omitted, exploded perspective view of a conductive sheet stack according to the embodiment.

As shown in FIG. 2, the conductive sheet stack 12 is provided by stacking a first conductive sheet 10A and a second conductive sheet 10B.

Figure 3A:
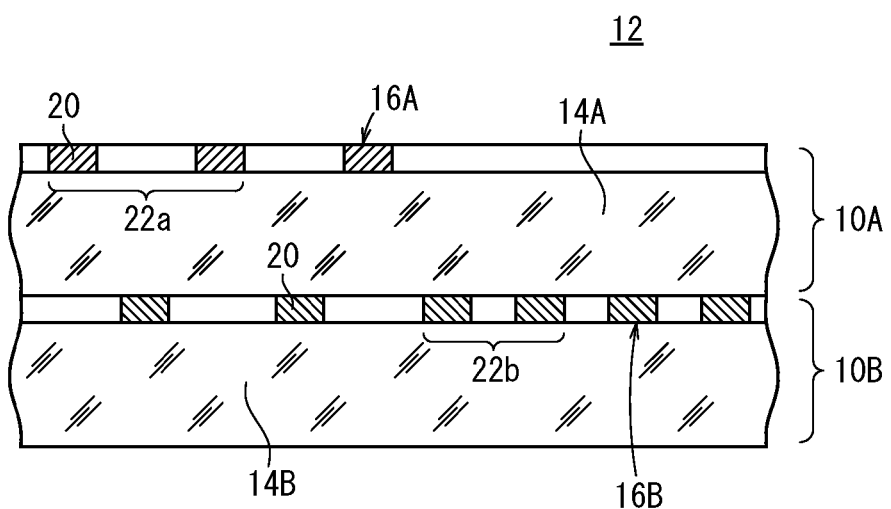
FIG. 3A is a partially-omitted, cross-sectional view of an example of the conductive sheet stack.
Figure 4:
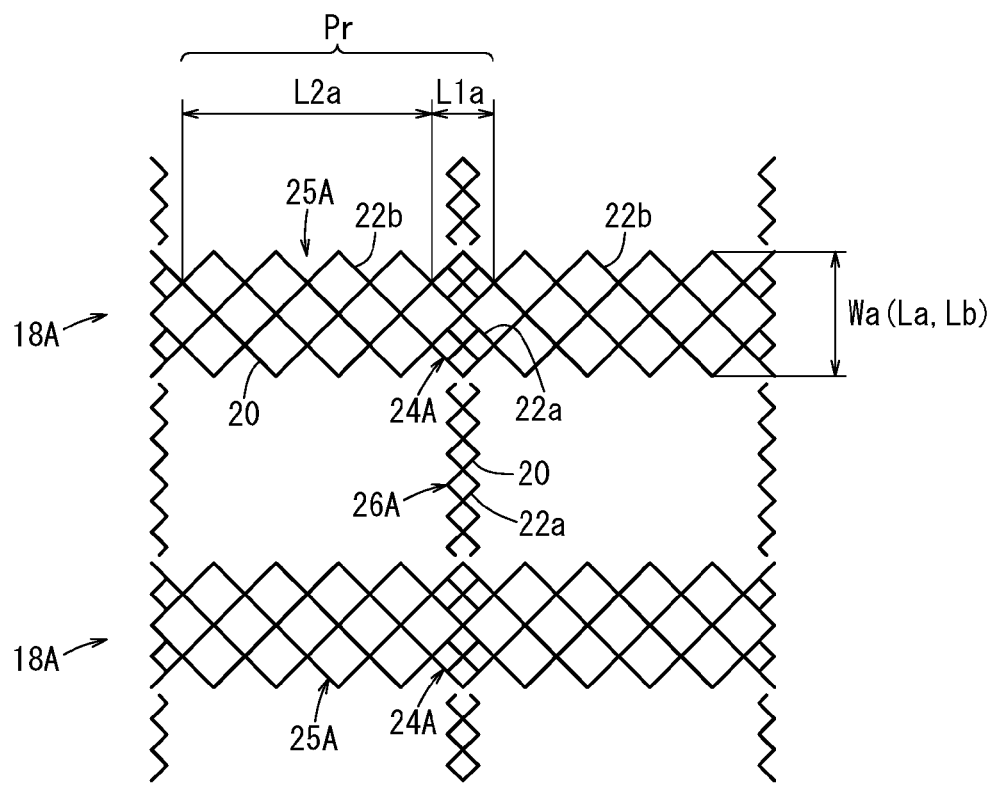
FIG. 4 is a plan view of a pattern example of a first conductive part formed on a first conductive sheet.

The first conductive sheet 10A has a first conductive part 16A formed on one main surface of a first transparent substrate 14A (see FIG. 3A). As shown in FIG. 4, the first conductive part 16A contains a plurality of strip-shaped first conductive patterns 18A extending in a first direction (an x direction). The first conductive patterns 18A are arranged in a second direction (a y direction, perpendicular to the first direction).

The first conductive pattern 18A contains a combination of a plurality of first lattices 22a and a plurality of second lattices 22b. The first lattices 22a and the second lattices 22b are composed of thin metal wires 20, and the second lattices 22b are larger than the first lattices 22a. Specifically, the first conductive sheet 10A is stacked on the second conductive sheet 10B such that the first conductive part 16A and the second conductive part 16B overlap with each other as hereinafter described. In this case, the second lattices 22b are used in the overlapping portions of the first conductive patterns 18A and the second conductive patterns 18B, and the first lattices 22a are used in the non-overlapping portions. In the first conductive pattern 18A, a first electrode 24A containing a plurality of the first lattices 22a (a first lattice portion) corresponds to the non-overlapping portion, and a first connection 25A containing a plurality of the second lattices 22b (a second lattice portion) corresponds to the overlapping portion. Thus, in the first conductive pattern 18A, a plurality of the first electrodes 24A are arranged with the first connections 25A interposed therebetween in the first direction (the x direction). In other words, a repeating unit pattern Pr is formed by a combination of the first electrode 24A and the first connection 25A adjacent thereto, and a plurality of the repeating unit patterns Pr are arranged in the first direction (the x direction).

The first lattice 22a and the second lattice 22b have similar rhombus (or square) shapes, and the side length of the second lattice 22b is m times greater than the side length of the first lattice 22a (in which m is a real number larger than 1). In the example of FIG. 4, the side length of the second lattice 22b is twice as large as that of the first lattice 22a. Of course, for example, the side length of the second lattice 22b may be 1.5, 2.5, or 3 times longer than that of the first lattice 22a. The side length of the first lattice 22a is preferably 30 to 500 µm, more preferably 50 to 400 µm, particularly preferably 100 to 350 µm. The first lattice 22a and the second lattice 22b may appropriately have an angle of 60° to 120°.

The first conductive part 16A has first auxiliary patterns 26A (first lattice portions) between adjacent first conductive patterns 18A. The first auxiliary patterns 26A are not connected to the first conductive patterns 18A. In the first auxiliary patterns 26A, a plurality of the first lattices 22a (six first lattices 22a in the example of FIG. 4) are arranged in the second direction, and particularly the end corners (facing the first conductive patterns 18A) of the terminal first lattices 22a are removed, so that the first lattices 22a are not connected to the first conductive patterns 18A. Thus, the first connections 25A containing the second lattices 22b are arranged in the second direction (the y direction), the first auxiliary patterns 26A containing the first lattices 22a are arranged at regular intervals, and the first auxiliary patterns 26A are not connected with the first connections 25A.

The thin metal wire 20 contains, for example, gold (Au), silver (Ag), or copper (Cu). The lower limit of the line width of the thin metal wire 20 may be 0.1 µm or more, and is preferably 1 µm or more, 3 µm or more, 4 µm or more, or 5 µm or more. The upper limit of the line width is preferably 15 µm or less, 10 µm or less, 9 µm or less, or 8 µm or less. When the line width is less than the lower limit, the thin metal wire 20 has an insufficient conductivity, whereby the touch panel 100 using the thin metal wire 20 has insufficient detection sensitivity. On the other hand, when the line width is more than the upper limit, moire is significantly generated due to the conductive metal portion, and the touch panel 100 using the thin metal wire 20 has a poor visibility. When the line width is within the above range, the moire generated due to the conductive patterns composed of the thin metal wires 20 is improved, and the visibility is remarkably improved. It is preferred that at least the first transparent substrate 14A has a thickness of 50 µm or more and 350 µm or less. The thickness is further preferably 80 µm or more and 250 µm or less, particularly preferably 100 µm or more and 200 µm or less.

As shown in FIG. 2, one end of the first conductive pattern 18A is electrically connected to a first terminal wiring pattern 42a composed of the thin metal wire 20 by a first wire connection 40a.

Figure 5:
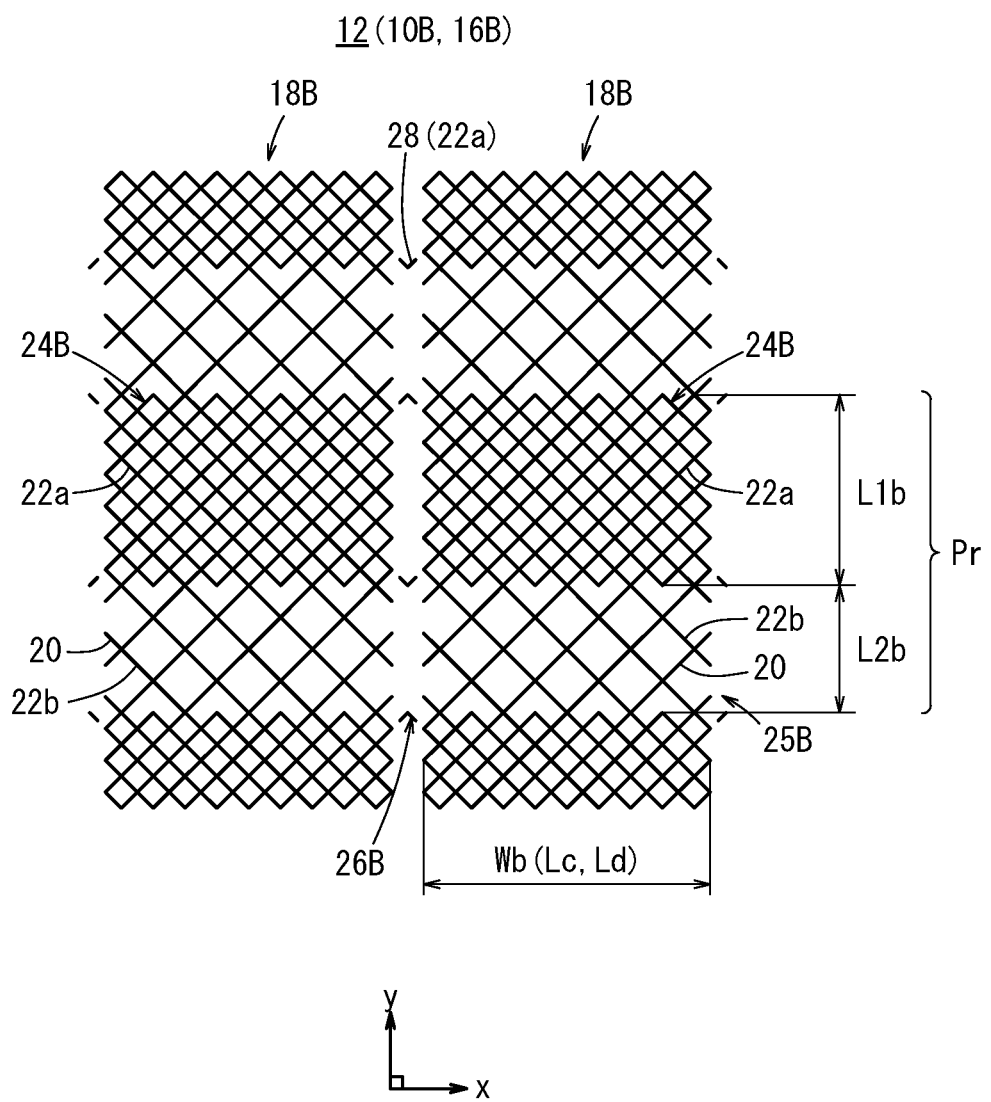
FIG. 5 is a plan view of a pattern example of a second conductive part formed on a second conductive sheet.

As shown in FIGS. 2, 3A, and 5, the second conductive sheet 10B has a second conductive part 16B formed on one main surface of a second transparent substrate 14B (see FIG. 3A). As shown in FIG. 5, the second conductive part 16B contains a plurality of strip-shaped second conductive patterns 18B extending in the second direction (the y direction). The second conductive patterns 18B are arranged in the first direction (the x direction).

The second conductive pattern 18B contains a combination of a plurality of the first lattices 22a and a plurality of the second lattices 22b composed of the thin metal wires 20 similarly to the first conductive pattern 18A. Specifically, the first conductive part 16A is stacked on the second conductive part 16B. In this case, the second lattices 22b are used in the overlapping portions of the first conductive patterns 18A and the second conductive patterns 18B, and the first lattices 22a are used in the non-overlapping portions. In the second conductive pattern 18B, a second electrode 24B containing a plurality of the first lattices 22a (a first lattice portion) corresponds to the non-overlapping portion, and a second connection 25B containing a plurality of the second lattices 22b (a second lattice portion) corresponds to the overlapping portion. Thus, in the second conductive pattern 18B, a plurality of the second electrodes 24B are arranged with the second connections 25B interposed therebetween in the second direction (the y direction). In other words, a repeating unit pattern Pr is formed by a combination of the second electrode 24B and the second connection 25B adjacent thereto, and a plurality of the repeating unit patterns Pr are arranged in the second direction (the y direction).

When the first conductive part 16A is stacked on the second conductive part 16B, the first connections 25A containing the second lattices 22b in the first conductive patterns 18A overlap with the second connections 25B containing the second lattices 22b in the second conductive patterns 18B. In this case, a connection point of the second lattice 22b in the second conductive pattern 18B is positioned at the center of an opening of the second lattice 22b in the first conductive pattern 18A.

The second conductive part 16B further has second auxiliary patterns 26B between the second conductive patterns 18B. The second auxiliary patterns 26B are not connected to the second conductive patterns 18B. In the second auxiliary patterns 26B, a plurality of L-shaped auxiliary wires 28 are arranged in the second direction (the y direction). The removed corner of the terminal first lattice 22a in the first auxiliary pattern 26A is compensated by the L-shape of the auxiliary wire 28. Thus, the second connections 25B containing the second lattices 22b are arranged in the first direction (the x direction), the second auxiliary patterns 26B containing the first lattices 22a are arranged at regular intervals, and the second auxiliary patterns 26B are not connected with the second connections 25B.

As shown in FIG. 2, for example, one end of each alternate odd-numbered second conductive pattern 18B and the other end of each even-numbered second conductive pattern 18B are each electrically connected to a second terminal wiring pattern 42b composed of the thin metal wire 20 by a second wire connection 40b.

As shown in FIG. 2, in the first conductive sheet 10A used in the touch panel 100, a large number of the first conductive patterns 18A are arranged in the sensing region 112, and a plurality of the first terminal wiring patterns 42a composed of the thin metal wires 20 extend from the first wire connections 40a in the terminal wiring region 114.

In the example of FIG. 1, the first conductive sheet 10A and the sensing region 112 each have a rectangular shape as viewed from above. In the terminal wiring region 114, a plurality of first terminals 116a are arranged in the longitudinal center in the length direction of the periphery on one long side of the first conductive sheet 10A. The first wire connections 40a are arranged in a straight line in the y direction along one long side of the sensing region 112 (a long side closest to the one long side of the first conductive sheet 10A). The first terminal wiring pattern 42a extends from each first wire connection 40a to the center of the one long side of the first conductive sheet 10A, and is electrically connected to the corresponding first terminal 116a. Thus, the first terminal wiring patterns 42a, connected to each of the corresponding first wire connections 40a formed on both ends of the one long side of the sensing region 112, have approximately the same lengths. Of course, the first terminals 116a may be formed in a corner of the first conductive sheet 10A or the vicinity thereof. However, in this case, the length difference between the longest first terminal wiring pattern 42a and the shortest first terminal wiring pattern 42a is increased, whereby the longest first terminal wiring pattern 42a and the first terminal wiring patterns 42a in the vicinity thereof are disadvantageously poor in the rate of transferring signal to the corresponding first conductive patterns 18A. Thus, in this embodiment, the first terminals 116a are formed in the longitudinal center of the one long side of the first conductive sheet 10A, whereby the local signal transfer rate deterioration is prevented to increase the response speed.

As shown in FIG. 2, in the second conductive sheet 10B used in the touch panel 100, a large number of the second conductive patterns 18B are arranged in the sensing region 112, and a plurality of the second terminal wiring patterns 42b extend from the second wire connections 40b in the terminal wiring region 114.

As shown in FIG. 1, in the terminal wiring region 114, a plurality of second terminals 116b are arranged in the longitudinal center in the length direction of the periphery on one long side of the second conductive sheet 10B. For example, the odd-numbered second wire connections 40b are arranged in a straight line in the x direction along one short side of the sensing region 112 (a short side closest to one short side of the second conductive sheet 10B), and the even-numbered second wire connections 40b are arranged in a straight line in the x direction along the other short side of the sensing region 112 (a short side closest to the other short side of the second conductive sheet 10B).

For example, each odd-numbered second conductive pattern 18B is connected to the corresponding odd-numbered second wire connection 40b, and each even-numbered second conductive pattern 18B is connected to the corresponding even-numbered second wire connection 40b. The second terminal wiring patterns 42b extend from the odd-numbered and even-numbered second wire connections 40b to the center of one long side of the second conductive sheet 10B, and are each electrically connected to the corresponding second terminal 116b. Thus, for example, the 1st and 2nd second terminal wiring patterns 42b have approximately the same lengths, and similarly the (2n−1)-th and (2n)-th second terminal wiring patterns 42b have approximately the same lengths (n=1, 2, 3, . . . ).

Of course, the second terminals 116b may be formed in a corner of the second conductive sheet 10B or the vicinity thereof. However, in this case, as described above, the longest second terminal wiring pattern 42b and the second terminal wiring patterns 42b in the vicinity thereof are disadvantageously poor in the rate of transferring signal to the corresponding second conductive patterns 18B. Thus, in this embodiment, the second terminals 116b are formed in the longitudinal center of the one long side of the second conductive sheet 10B, whereby the local signal transfer rate deterioration is prevented to increase the response speed.

The first terminal wiring patterns 42a may be arranged in the same manner as the above second terminal wiring patterns 42b, and the second terminal wiring patterns 42b may be arranged in the same manner as the above first terminal wiring patterns 42a.

When the conductive sheet stack 12 is used in the touch panel 100, the protective layer 106 is formed on the first conductive sheet 10A, and the first terminal wiring patterns 42a extending from the first conductive patterns 18A in the first conductive sheet 10A and the second terminal wiring patterns 42b extending from the second conductive patterns 18B in the second conductive sheet 10B are connected to a scan control circuit or the like. Incidentally, the first conductive part 16A is located closer to an input operation surface, and a second conductive part 16B is located closer to the display panel 110.

A self or mutual capacitance technology can be preferably used for detecting the touch position. In the self capacitance technology, a voltage signal for the touch position detection is sequentially supplied to the first conductive patterns 18A, and further a voltage signal for the touch position detection is sequentially supplied to the second conductive patterns 18B. When a finger comes into contact with or close to the upper surface of the protective layer 106, the capacitance between the first conductive pattern 18A and the second conductive pattern 18B in the touch position and the GND (ground) is increased, whereby signals from this first conductive pattern 18A and this second conductive pattern 18B have waveforms different from those of signals from the other conductive patterns. Thus, the touch position is calculated by a control circuit based on the signals transmitted from the first conductive pattern 18A and the second conductive pattern 18B. On the other hand, in the mutual capacitance technology, for example, a voltage signal for the touch position detection is sequentially supplied to the first conductive patterns 18A, and the second conductive patterns 18B are sequentially subjected to sensing (transmitted signal detection). When a finger comes into contact with or close to the upper surface of the protective layer 106, the parallel stray capacitance of the finger is added to the parasitic capacitance between the first conductive pattern 18A and the second conductive pattern 18B in the touch position, whereby a signal from this second conductive pattern 18B has a waveform different from those of signals from the other second conductive patterns 18B. Thus, the touch position is calculated by a control circuit based on the order of the first conductive pattern 18A supplied with the voltage signal and the signal transmitted from the second conductive pattern 18B. Even when two fingers come into contact with or close to the upper surface of the protective layer 106 simultaneously, the touch positions can be detected by using the self or mutual capacitance technology. Conventional related detection circuits used in the projected capacitive technologies are described in U.S. Pat. Nos. 4,582,955, 4,686,332, 4,733,222, 5,374,787, 5,543,588, and 7,030,860, U.S. Patent Publication No. 2004/0155871, etc.

In this embodiment, in the terminal wiring region 114, the first terminals 116a are formed in the longitudinal center of the periphery on the one long side of the first conductive sheet 10A, and the second terminals 116b are formed in the longitudinal center of the periphery on the one long side of the second conductive sheet 10B. Particularly, in the example of FIG. 1, the first terminals 116a and the second terminals 116b are close to each other and do not overlap with each other, and the first terminal wiring patterns 42a and the second terminal wiring patterns 42b do not overlap with each other. For example, the first terminal 116a may partially overlap with the odd-numbered second terminal wiring pattern 42b.

Thus, the first terminals 116a and the second terminals 116b can be electrically connected to the control circuit by using a cable and two connectors (a connector for the first terminals 116a and a connector for the second terminals 116b) or one connector (a complex connector for the first terminals 116a and the second terminals 116b).

Since the first terminal wiring patterns 42a and the second terminal wiring patterns 42b do not vertically overlap with each other, a parasitic capacitance is reduced between the first terminal wiring patterns 42a and the second terminal wiring patterns 42b to prevent the response speed deterioration.

Since the first wire connections 40a are arranged along the one long side of the sensing region 112 and the second wire connections 40b are arranged along the both short sides of the sensing region 112, the area of the terminal wiring region 114 can be reduced. Therefore, the size of the display panel 110 having the touch panel 100 can be easily reduced, and the display screen 110a can be made to seem larger. Also, the operability of the touch panel 100 can be improved.

The area of the terminal wiring region 114 may be further reduced by reducing the distance between the adjacent first terminal wiring patterns 42a or the adjacent second terminal wiring patterns 42b. The distance is preferably 10 μm or more and 50 μm or less in view of preventing migration.

Alternatively, the area of the terminal wiring region 114 may be reduced by arranging the second terminal wiring pattern 42b between the adjacent first terminal wiring patterns 42a in the view from above. However, when the pattern is misaligned, the first terminal wiring pattern 42a may vertically overlap with the second terminal wiring pattern 42b, tending to increase the parasitic capacitance therebetween. This leads to deterioration of the response speed. Thus, in the case of using such an arrangement, the distance between the adjacent first terminal wiring patterns 42a is preferably 50 μm or more and 100 μm or less.

As shown in FIG. 1, first alignment marks 118a and second alignment marks 118b are preferably formed on the corners, etc., of the first conductive sheet 10A and the second conductive sheet 10B. The first alignment marks 118a and the second alignment marks 118b are used for positioning the sheets in the process of bonding the sheets. When the first conductive sheet 10A and the second conductive sheet 10B are bonded to obtain the conductive sheet stack 12, the first alignment marks 118a and the second alignment marks 118b form composite alignment marks. The composite alignment marks may be used for positioning the conductive sheet stack 12 in the process of being attached to the display panel 110.

Figure 6:
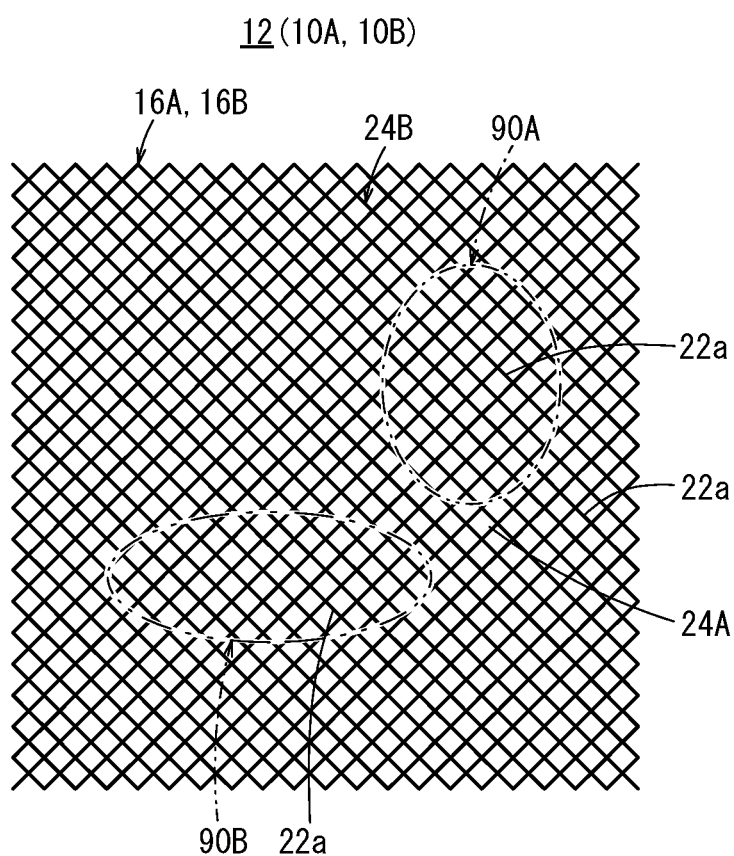
FIG. 6 is a partially-omitted, plan view of the conductive sheet stack formed by combining the first and second conductive sheets.

As shown in FIG. 6, when the first conductive sheet 10A is stacked on the second conductive sheet 10B to form the conductive sheet stack 12, the second lattices 22b in the first conductive patterns 18A and the second lattices 22b in the second conductive patterns 18B overlap with each other to form first combined patterns 90A. In this case, the connection point of the second lattice 22b in the second conductive pattern 18B is positioned at the center of the opening of the second lattice 22b in the first conductive pattern 18A. Therefore, the first combined pattern 90A contains a combination of a plurality of the first lattices 22a.

Furthermore, when the first conductive part 16A is stacked on the second conductive part 16B, the first auxiliary patterns 26A and the second auxiliary patterns 26B overlap with each other to form second combined patterns 90B. In this case, the removed corner of the terminal first lattice 22a in the first auxiliary pattern 26A is compensated by the auxiliary wire 28 (see FIG. 5) in the second auxiliary pattern 26B. Thus, also the second combined pattern 90B contains a combination of a plurality of the first lattices 22a.

Consequently, as shown in FIG. 6, the entire surface is covered with the first lattices 22a, and the boundaries between the first electrodes 24A and the second electrodes 24B containing the first lattices 22a can hardly be found.

For example, in the case of not forming the first auxiliary patterns 26A and the second auxiliary patterns 26B, blank areas corresponding to the width of the second combined pattern 90B are formed, whereby the edges of the first electrodes 24A and the second electrodes 24B are highly visible, causing deterioration in visibility. In contrast, in this embodiment, the first auxiliary patterns 26A and the second auxiliary patterns 26B are stacked in the above manner, whereby the boundaries between the first electrodes 24A and the second electrodes 24B are made less visible to improve the visibility.

In this embodiment, the first electrodes 24A and the second electrodes 24B do not overlap with each other, and a parasitic capacitance is hardly formed between the first electrodes 24A and the second electrodes 24B. Meanwhile, the second lattices 22b in the first conductive patterns 18A overlap with the second lattices 22b in the second conductive patterns 18B to form a parasitic capacitance therebetween. Thus, only several points of the second lattices 22b, which are larger than the first lattices 22a, overlap with each other. Therefore, the thin metal wires 20 overlap with each other only at the several points, and the first transparent substrate 14A has a thickness of 50 μm or more and 350 μm or less, so that only a small parasitic capacitance is formed between the first conductive patterns 18A and the second conductive patterns 18B. In addition, when the thickness of the first transparent substrate 14A is within the above range, a desired visible light transmittance can be obtained, and the first transparent substrate 14A can be easily handled.

In the conductive sheet stack 12, the maximum width Wb of the second conductive pattern 18B (see FIG. 5) is larger than the maximum width Wa of the first conductive pattern 18A (see FIG. 4), and the number of the first lattices 22a in the second conductive pattern 18B is significantly larger than that in the first conductive pattern 18A, so that the occupation area of the second conductive patterns 18B is larger than that of the first conductive patterns 18A. The ratio Wb/Wa of the maximum width Wb of the second conductive pattern 18B to the maximum width Wa of the first conductive pattern 18A preferably satisfies the condition of 1<Wb/Wa≤10, more preferably satisfies the condition of 2≤Wb/Wa≤8, and particularly preferably satisfies the condition of 3≤Wb/Wa≤5. In the example of FIGS. 4 and 5, the ratio Wb/Wa is 2.5.

In general, the second conductive patterns 18B, which are located closer to the display device 108, can act to reduce noise impact of an electromagnetic wave. Thus, a skin current flows in a particular direction to block an electric-field component of the electromagnetic wave, and an eddy current flows in a particular direction to block a magnetic-field component of the electromagnetic wave, whereby the noise impact of the electromagnetic wave can be reduced. In the conductive sheet stack 12, since the occupation area of the second conductive patterns 18B closer to the display device 108 is larger than that of the first conductive patterns 18A, the second conductive patterns 18B can have a low surface resistance of 70 ohm/sq or less. Consequently, the conductive sheet stack 12 is advantageous in the reduction of the noise impact of the electromagnetic wave from the display device 108 or the like.

In this embodiment, the occupation area of the second electrodes 24B is larger than that of the first electrodes 24A. Therefore, in the case of using the self capacitance technology for the finger touch position detection, though the second electrodes 24B are positioned at a longer distance from the touch position than the first electrodes 24A, the second electrodes 24B can store a large amount of signal charge in the same manner as the first electrodes 24A, and the second electrodes 24B can exhibit a detection sensitivity approximately equal to that of the first electrodes 24A. Thus, the burden of signal processing can be reduced, and the detection accuracy can be improved. In the case of using the mutual capacitance technology for the finger touch position detection, the second electrodes 24B having the larger occupation area can be used as drive electrodes, the first electrodes 24A can be used as receiving electrodes, and the first electrodes 24A can exhibit a high receiving sensitivity. Furthermore, even in a case where the first conductive patterns 18A partially overlap with the second conductive patterns 18B to form a parasitic capacitance, since the first transparent substrate 14A has a thickness of 50 μm or more and 350 μm or less, the increase of the parasitic capacitance can be prevented, and the reduction of the detection sensitivity can be prevented.

In this embodiment, in the first conductive pattern 18A, the length La (=Wa) of the first electrode 24A is approximately equal to the length Lb (=Wa) of the first connection 25A in the second direction (the y direction). In addition, in the second conductive pattern 18B, the length Lc (=Wb) of the second electrode 24B is approximately equal to the length Ld (=Wb) of the second connection 25B in the first direction (the x direction). Therefore, the first conductive patterns 18A and the second conductive patterns 18B can have an excellent conductivity to improve the detection sensitivity.

In the first conductive pattern 18A, the length L1a of the first electrode 24A and the length L2a of the first connection 25A in the first direction (the x direction) satisfy the inequality of L1a<L2a. In this case, for example, in the mutual capacitance technology, the first electrodes 24A can be used as receiving electrodes with high receiving sensitivity. The lengths L1a and L2a preferably satisfy the inequality of 1.5×L1a≤L2a≤6×L1a. In the example of FIG. 4, L2a is equal to 4L1a. In the second conductive pattern 18B, the length L1b of the second electrode 24B and the length L2b of the second connection 25B in the second direction (the y direction) satisfy the inequality of L1b>L2b. In this case, for example, in the mutual capacitance technology, the second electrodes 24B can be used as drive electrodes with high detection sensitivity. The lengths L1b and L2b preferably satisfy the inequality of 1.5×L2b≤L1b≤6×L2b. In the example of FIG. 5, L1b is equal to (3/2)L2b.

Consequently, even in the case of using the patterns of the thin metal wires 20 in the electrodes, the thin metal wires 20 are less visible, and the conductive sheet stack 12 can have a high transparency, an improved S/N ratio of detection signal, improved detection sensitivity, and an improved detection accuracy.

When the first conductive patterns 18A have an occupation area A1 and the second conductive patterns 18B have an occupation area A2, the conductive sheet stack 12 preferably satisfies the condition of 1<A2/A1≤20, more preferably satisfies the condition of 1<A2/A1≤10, and particularly preferably satisfies the condition of 2≤A2/A1≤10.

Furthermore, when the first electrodes 24A have an occupation area a1 and the second electrodes 24B have an occupation area a2, the conductive sheet stack 12 preferably satisfies the condition of 1<a2/a1≤20, more preferably satisfies the condition of 1<a2/a1≤10, and particularly preferably satisfies the condition of 2≤a2/a1≤10.

The sizes of the first electrodes 24A and the second electrodes 24B are not particularly limited as long as they can satisfactorily detect the touch position of the human finger or input pen.

Though the first lattice 22a and the second lattice 22b each have a rhombic shape in the above example, they may have another triangle or polygonal shape. The triangle shape can be easily formed e.g. by disposing a straight thin metal wire on a diagonal line of the rhombus of the first lattice 22a or the second lattice 22b of FIGS. 4 and 5. Each side of the first lattice 22a and the second lattice 22b may have a straight line shape, a curved shape, or an arc shape. In the case of using arc-shaped sides, for example, two opposite sides may have an outwardly protruding arc shape, and the other two opposite sides may have an inwardly protruding arc shape. Alternatively, each side may have a wavy shape containing outwardly protruding arcs and inwardly protruding arcs arranged continuously. Of course, each side may have a sine curve shape.

Also the sizes of the first lattices 22a (including the side lengths and the diagonal line lengths), the number of the first lattices 22a in the first electrodes 24A, and the number of the first lattices 22a in the second electrodes 24B may be appropriately selected depending on the size and the resolution (the line number) of the touch panel 100.

Several variant examples of the conductive sheet stack 12 will be described below with reference to FIGS. 7A to 9B.

A conductive sheet stack 12a according to a first variant example has approximately the same structure as the above conductive sheet stack 12, but is different in the following respects.

Figure 7A:
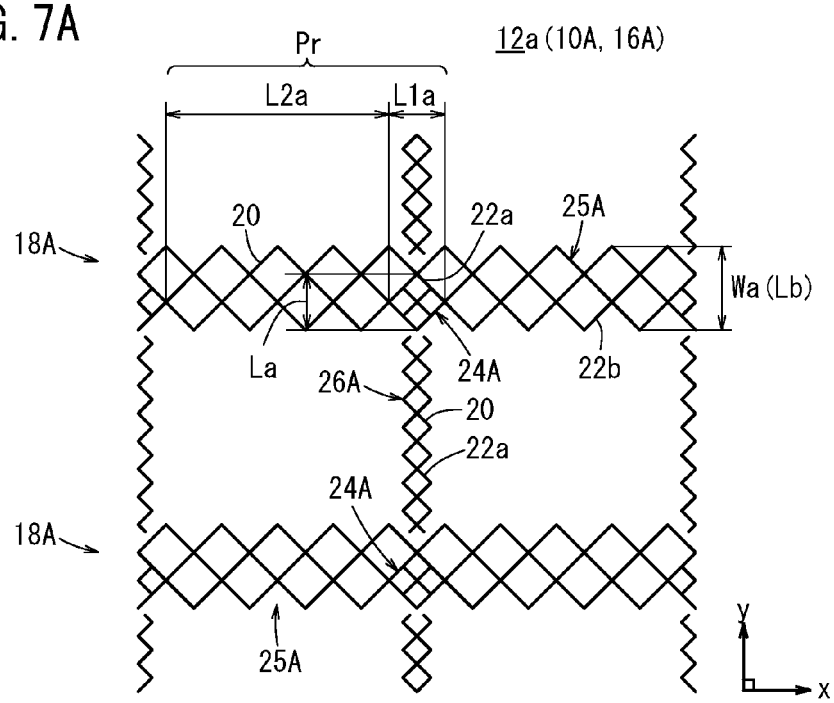
FIG. 7A is a plan view of a pattern example of a first conductive part formed on a first conductive sheet in a conductive sheet stack according to a first variant example.
Figure 7B:
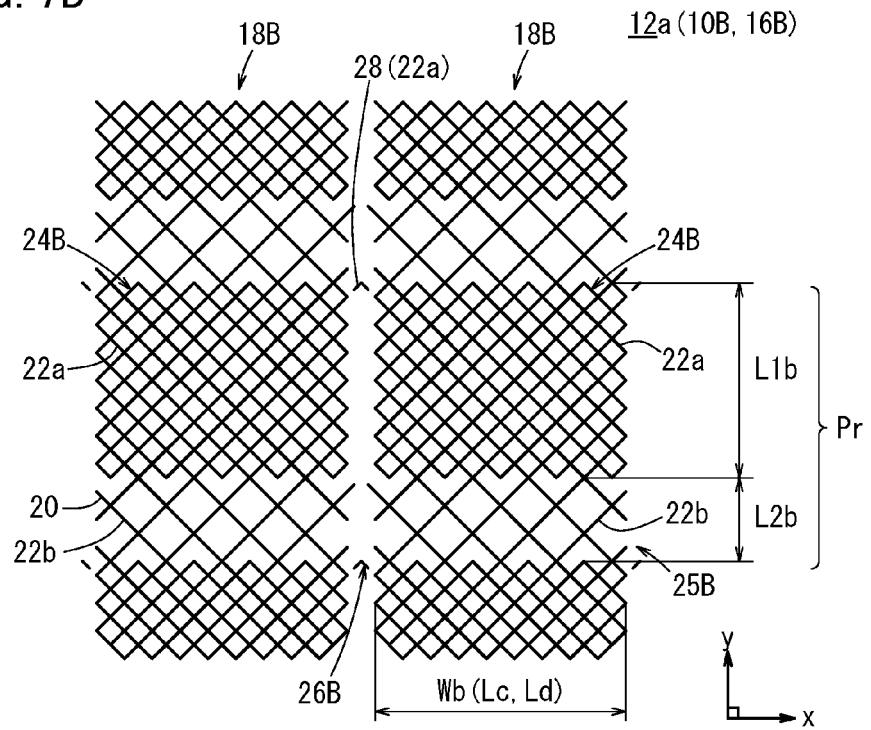
FIG. 7B is a plan view of a pattern example of a second conductive part formed on a second conductive sheet in the conductive sheet stack.

As shown in FIGS. 7A and 7B, the ratio Wb/Wa of the maximum width Wb of the second conductive pattern 18B to the maximum width Wa of the first conductive pattern 18A is 3. Furthermore, as shown in FIG. 7A, in the first conductive pattern 18A, the length Lb (=Wa) of the first connection 25A is 1.5 times larger than the length La of the first electrode 24A in the second direction (the y direction). Incidentally, in the second conductive pattern 18B, the length Lc (=Wb) of the second electrode 24B is approximately equal to the length Ld (=Wb) of the second connection 25B in the first direction (the x direction).

In addition, as shown in FIG. 7B, in the second conductive pattern 18B, the length L1b of the second electrode 24B and the length L2b of the second connection 25B in the second direction (the y direction) satisfy the condition of L1b=(7/3)L2b. Incidentally, in the first conductive pattern 18A, the length L1a of the first electrode 24A and the length L2a of the first connection 25A in the first direction (the x direction) satisfy the condition of L2a=4L1a.

Thus, the ratio A2/A1 of the occupation area A2 of the second conductive patterns 18B to the occupation area A1 of the first conductive patterns 18A in the conductive sheet stack 12a of the first variant example can be larger than that in the above conductive sheet stack 12, and the conductive sheet stack 12a can more effectively act to reduce the noise impact of the electromagnetic wave from the display device 108 or the like.

Furthermore, the ratio a2/a1 of the occupation area a2 of the second electrodes 24B to the occupation area a1 of the first electrodes 24A in the conductive sheet stack 12a of the first variant example can be larger than that in the above conductive sheet stack 12, and the detection accuracy in the self capacitance technology and the receiving sensitivity in the mutual capacitance technology can be further improved in the first variant example.

A conductive sheet stack 12b according to a second variant example has approximately the same structure as the above conductive sheet stack 12, but is different in the following respects.

Figure 8A:
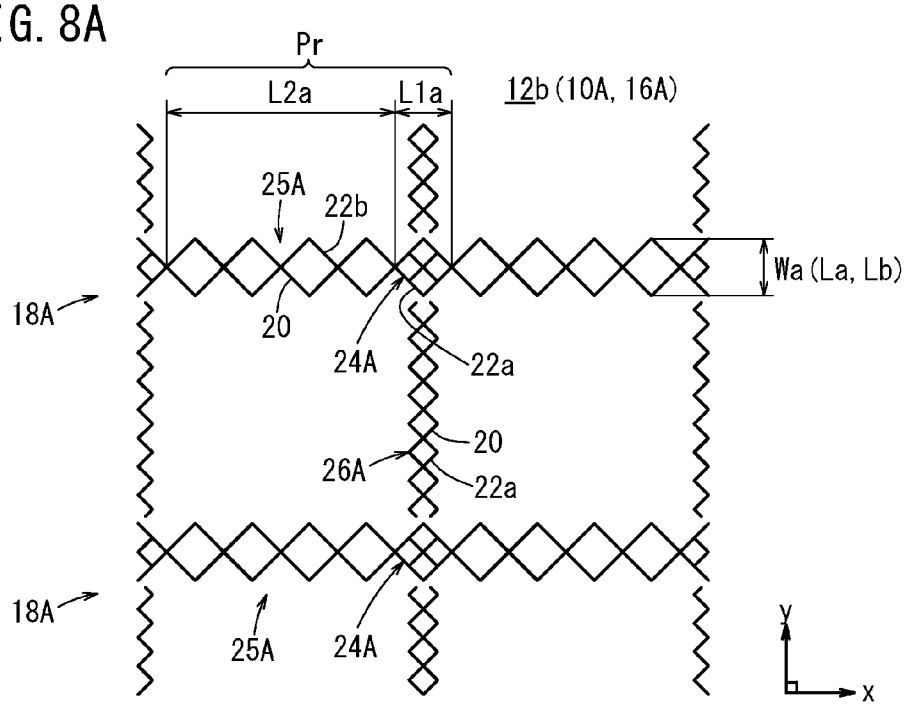
FIG. 8A is a plan view of a pattern example of a first conductive part formed on a first conductive sheet in a conductive sheet stack according to a second variant example.
Figure 8B:
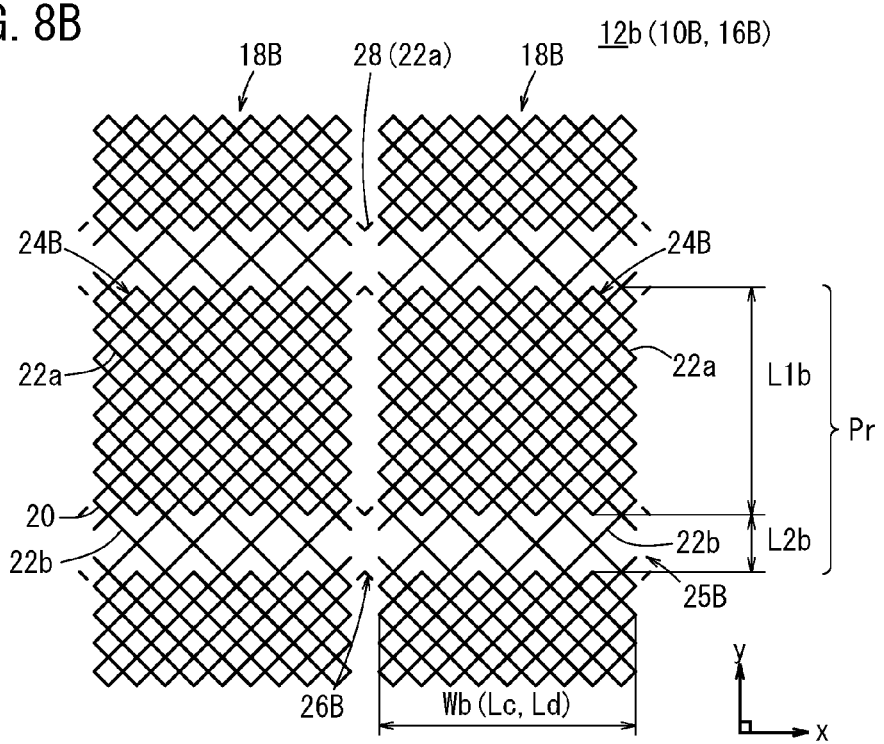
FIG. 8B is a plan view of a pattern example of a second conductive part formed on a second conductive sheet in the conductive sheet stack.

As shown in FIGS. 8A and 8B, the ratio Wb/Wa of the maximum width Wb of the second conductive pattern 18B to the maximum width Wa of the first conductive pattern 18A is 4.5. Furthermore, as shown in FIG. 8B, in the second conductive pattern 18B, the length L1b of the second electrode 24B and the length L2b of the second connection 25B in the second direction (the y direction) satisfy the condition of L1b=4×L2b.

Incidentally, as shown in FIG. 8A, in the first conductive pattern 18A, the length La (=Wa) of the first electrode 24A is approximately equal to the length Lb (=Wa) of the first connection 25A in the second direction (the y direction), and the length L1a of the first electrode 24A and the length L2a of the first connection 25A in the first direction (the x direction) satisfy the condition of L2a=4L1a. In addition, as shown in FIG. 8B, in the second conductive pattern 18B, the length Lc (=Wb) of the second electrode 24B is approximately equal to the length Ld (=Wb) of the second connection 25B in the first direction (the x direction).

Thus, the ratio A2/A1 of the occupation area A2 of the second conductive patterns 18B to the occupation area A1 of the first conductive patterns 18A in the conductive sheet stack 12*b* of the second variant example can be larger than those in the above conductive sheet stacks 12 and 12*a*, and the conductive sheet stack 12*b* can more effectively act to reduce the noise impact of the electromagnetic wave from the display device 108 or the like.

Furthermore, the ratio a2/a1 of the occupation area a2 of the second electrodes 24B to the occupation area a1 of the first electrodes 24A in the conductive sheet stack 12*b* of the second variant example can be larger than those in the above conductive sheet stacks 12 and 12*a*, and the detection accuracy in the self capacitance technology and the receiving sensitivity in the mutual capacitance technology can be further improved in the second variant example.

A conductive sheet stack 12*c* according to a third variant example has approximately the same structure as the above conductive sheet stack 12, but is different in the following respects.

Figure 9A:
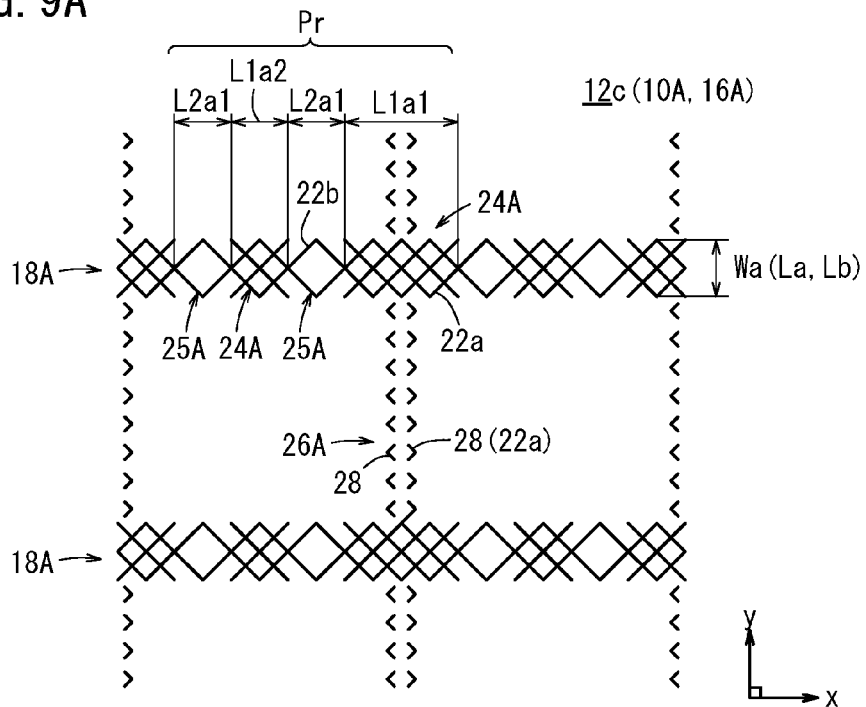
FIG. 9A is a plan view of a pattern example of a first conductive part formed on a first conductive sheet in a conductive sheet stack according to a third variant example.

As shown in FIG. 9A, in the first conductive pattern 18A, one repeating unit pattern Pr contains two first electrodes 24A containing a plurality of the first lattices 22*a* and two first connections 25A containing the second lattice 22*b*. In the one repeating unit pattern Pr, the total length L1a (=L1a1+L1a2) of the two first electrodes 24A and the total length L2a (=2× L2a1) of the two first connections 25A in the first direction (the x direction) satisfy the condition of L2a=2L1a/3, thus L2a<L1a.

Furthermore, in the first auxiliary patterns 26A, a pair of L-shaped auxiliary wires 28 (parts of the first lattice 22*a*) are arranged in the second direction. The first auxiliary patterns 26A are not connected to the first conductive patterns 18A. Thus, also in this example, the first connections 25A containing the second lattices 22*b* are arranged in the second direction (the y direction), the first auxiliary patterns 26A containing the first lattices 22*a* are arranged at regular intervals, and the first auxiliary patterns 26A are not connected with the first connections 25A.

In the stack of the first conductive part 16A and the second conductive part 16B, a portion in the second conductive pattern 18B, which overlaps with the first connection 25A in the first conductive pattern 18A, contains the second lattices 22*b*, and a portion in the second conductive pattern 18B, which does not overlap with the first conductive pattern 18A, contains a plurality of the first lattices 22*a*. The portion containing the first lattices 22*a* acts as the second electrode 24B, and the portion containing the second lattices 22*b* acts as the second connection 25B. Thus, the repeating unit patterns Pr contains the second electrode 24B and the second connection 25B adjacent thereto, and a plurality of the repeating unit patterns Pr are arranged in the second direction (the y direction).

In the second auxiliary patterns 26B, a plurality of cross-shaped auxiliary wires 29 are arranged in the second direction (the y direction). The cross-shaped auxiliary wire 29 is combined with a pair of the L-shaped auxiliary wires 28 in the first auxiliary pattern 26A to form the first lattice 22*a*. Thus, also in this example, the second connections 25B containing the second lattices 22*b* are arranged in the first direction (the x direction), the second auxiliary patterns 26B containing the first lattices 22*a* are arranged at regular intervals, and the second auxiliary patterns 26B are not connected with the second connections 25B.

Figure 9B:
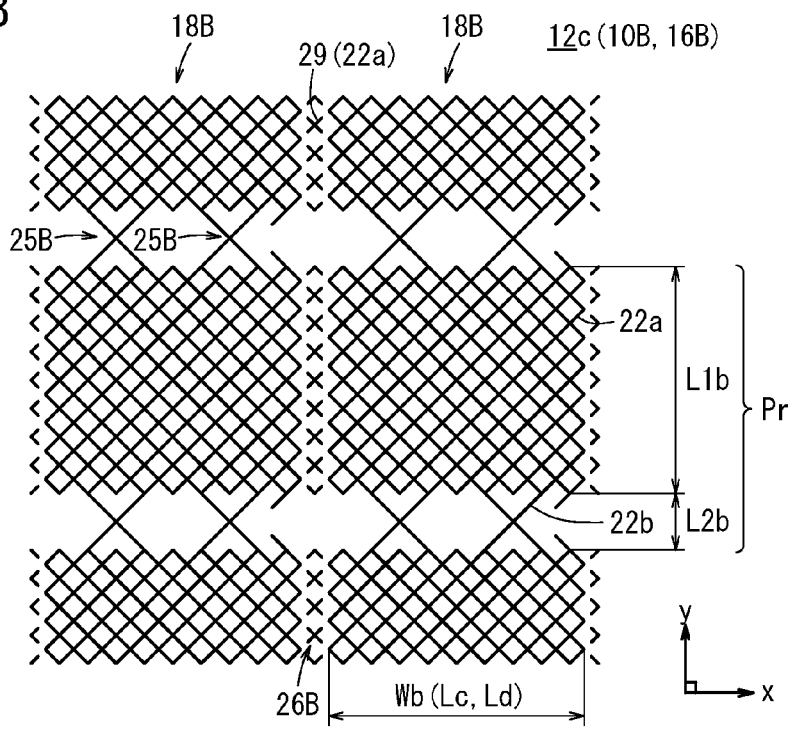
FIG. 9B is a plan view of a pattern example of a second conductive part formed on a second conductive sheet in the conductive sheet stack.

As shown in FIGS. 9A and 9B, the ratio Wb/Wa of the maximum width Wb of the second conductive pattern 18B to the maximum width Wa of the first conductive pattern 18A is 4.5. Furthermore, as shown in FIG. 9B, in the second conductive pattern 18B, the length L1b of the second electrode 24B and the length L2b of the second connection 25B in the second direction (the y direction) satisfy the condition of L1b=4×L2b.

Incidentally, as shown in FIG. 9A, in the first conductive pattern 18A, the length La (=Wa) of the first electrode 24A is approximately equal to the length Lb (=Wa) of the first connection 25A in the second direction (the y direction). In addition, as shown in FIG. 9B, in the second conductive pattern 18B, the length Lc (=Wb) of the second electrode 24B is approximately equal to the length Ld (=Wb) of the second connection 25B in the first direction (the x direction).

The conductive sheet stack 12*c* of the third variant example has the same advantageous effects as the above conductive sheet stack 12*b* of the second variant example. Furthermore, two types of the first electrodes are arranged in one repeating unit pattern, so that the conductive sheet stack 12*c* can store a signal charge corresponding to the touch position of the finger or the input pen, and the detection sensitivity can be improved.

Though the conductive sheet stacks 12 (including the stacks of the first to third variant examples) are used in the projected capacitive touch panel 100 in the above examples, they may be used in a surface capacitive touch panel or a resistive touch panel. All of the conductive sheet stacks 12 (including the stacks of the first to third variant examples) are hereinafter referred to as the conductive sheet stack 12.

Figure 3B:
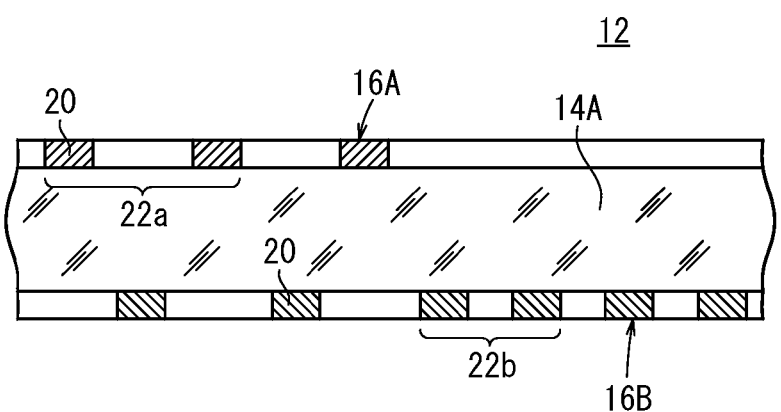
FIG. 3B is a partially-omitted, cross-sectional view of another example of the conductive sheet stack.

In the above conductive sheet stack 12, as shown in FIG. 3A, the first conductive part 16A is formed on the one main surface of the first transparent substrate 14A, the second conductive part 16B is formed on the one main surface of the second transparent substrate 14B, and they are stacked. Alternatively, as shown in FIG. 3B, the first conductive part 16A may be formed on the one main surface of the first transparent substrate 14A, and the second conductive part 16B may be formed on the other main surface of the first transparent substrate 14A. In this case, the second transparent substrate 14B is not used, the first transparent substrate 14A is stacked on the second conductive part 16B, and the first conductive part 16A is stacked on the first transparent substrate 14A. In addition, another layer may be disposed between the first conductive sheet 10A and the second conductive sheet 10B. The first conductive part 16A and the second conductive part 16B may be arranged facing each other as long as they are insulated.

The first conductive part 16A and the second conductive part 16B may be formed as follows. For example, a photosensitive material having the first transparent substrate 14A or the second transparent substrate 14B and thereon a photosensitive silver halide-containing emulsion layer may be exposed and developed, whereby metallic silver portions and light-transmitting portions may be formed in the exposed areas and the unexposed areas respectively to obtain the first conductive part 16A and the second conductive part 16B. The metallic silver portions may be subjected to a physical development treatment and/or a plating treatment to deposit a conductive metal thereon.

As shown in FIG. 3B, the first conductive part 16A may be formed on the one main surface of the first transparent substrate 14A, and the second conductive part 16B may be formed on the other main surface thereof. In this case, when the one main surface is exposed and then the other main surface is exposed in the usual method, the desired patterns cannot be obtained on the first conductive part 16A and the second conductive part 16B occasionally. In particular, it is difficult to uniformly form the first auxiliary patterns 26A between the first conductive patterns 18A, the second auxiliary patterns 26B between the second conductive patterns 18B, and the like, as shown in FIGS. 4, 7, etc.

Therefore, the following production method can be preferably used.

Thus, the first conductive part 16A on the one main surface and the second conductive part 16B on the other main surface can be formed by subjecting the photosensitive silver halide emulsion layers on both sides of the first transparent substrate 14A to one-shot exposure.

A specific example of the production method will be described below with reference to FIGS. 10 to 12.

Figure 10:
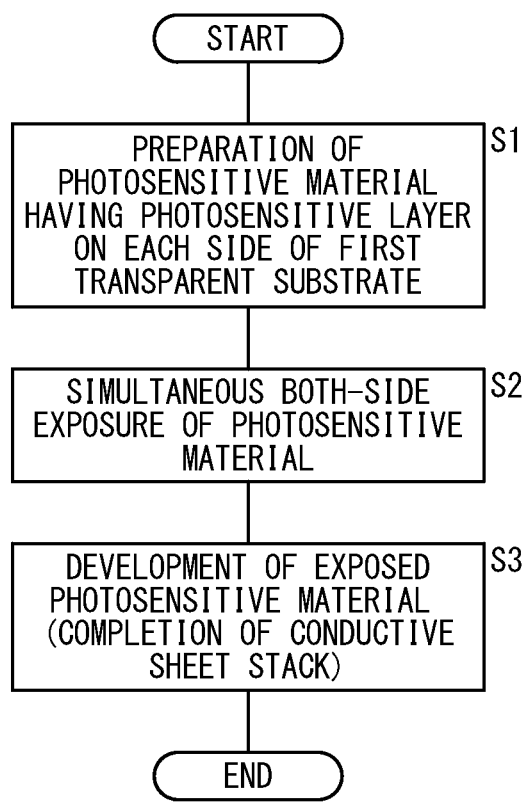
FIG. 10 is a flow chart of a method for producing the conductive sheet stack of the embodiment.
Figure 11A:
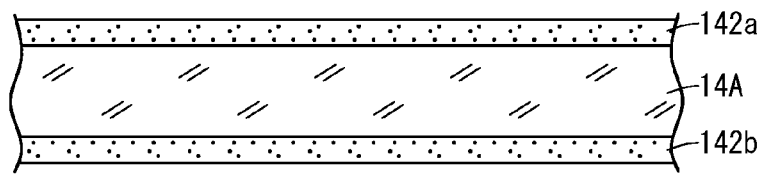
FIG. 11A is a partially-omitted, cross-sectional view of a produced photosensitive material.

First, in step S1 of FIG. 10, a long photosensitive material 140 is prepared. As shown in FIG. 11A, the photosensitive material 140 has the first transparent substrate 14A, a photosensitive silver halide emulsion layer formed on one main surface of the first transparent substrate 14A (hereinafter referred to as the first photosensitive layer 142a), and a photosensitive silver halide emulsion layer formed on the other main surface of the first transparent substrate 14A (hereinafter referred to as the second photosensitive layer 142b).

Figure 11B:
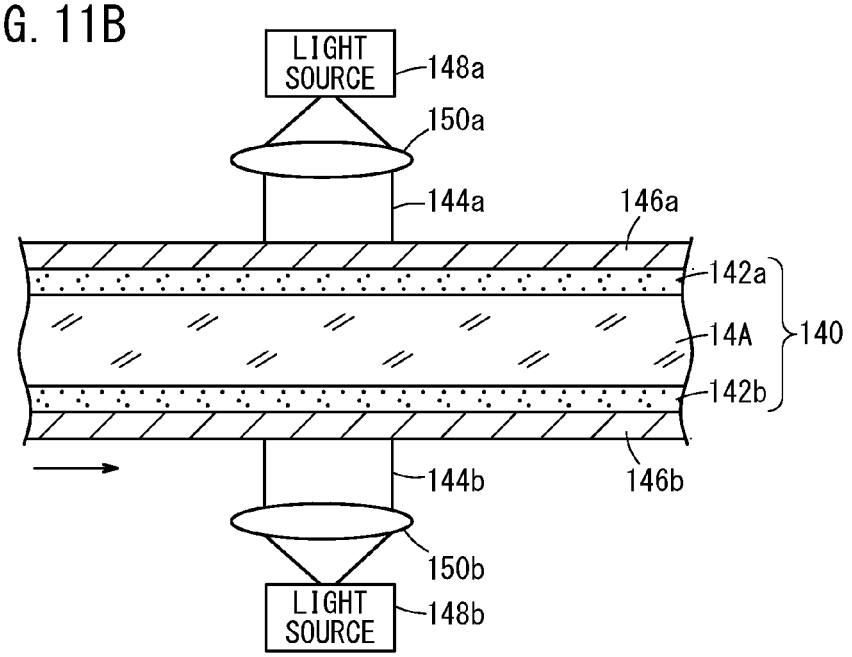
FIG. 11B is an explanatory view for illustrating simultaneous both-side exposure of the photosensitive material.

In step S2 of FIG. 10, the photosensitive material 140 is exposed. In this exposure step, a simultaneous both-side exposure, which includes a first exposure treatment for irradiating the first photosensitive layer 142a on the first transparent substrate 14A with a light in a first exposure pattern and a second exposure treatment for irradiating the second photosensitive layer 142b on the first transparent substrate 14A with a light in a second exposure pattern, is carried out. In the example of FIG. 11B, the first photosensitive layer 142a is irradiated through a first photomask 146a with a first light 144a (a parallel light), and the second photosensitive layer 142b is irradiated through a second photomask 146b with a second light 144b (a parallel light), while conveying the long photosensitive material 140 in one direction. The first light 144a is such that a light from a first light source 148a is converted to the parallel light by an intermediate first collimator lens 150a, and the second light 144b is such that a light from a second light source 148b is converted to the parallel light by an intermediate second collimator lens 150b. Though two light sources (the first light source 148a and the second light source 148b) are used in the example of FIG. 11B, only one light source may be used. In this case, a light from the one light source may be divided by an optical system into the first light 144a and the second light 144b for exposing the first photosensitive layer 142a and the second photosensitive layer 142b.

In step S3 of FIG. 10, the exposed photosensitive material 140 is developed to prepare e.g. the conductive sheet stack 12 shown in FIG. 3B. The conductive sheet stack 12 has the first transparent substrate 14A, the first conductive part 16A formed in the first exposure pattern on the one main surface of the first transparent substrate 14A, and the second conductive part 16B formed in the second exposure pattern on the other main surface of the first transparent substrate 14A. Preferred exposure time and development time for the first photosensitive layer 142a and the second photosensitive layer 142b depend on the types of the first light source 148a, the second light source 148b, and a developer, etc., and cannot be categorically determined. The exposure time and development time may be selected in view of achieving a development ratio of 100%.

Figure 12:
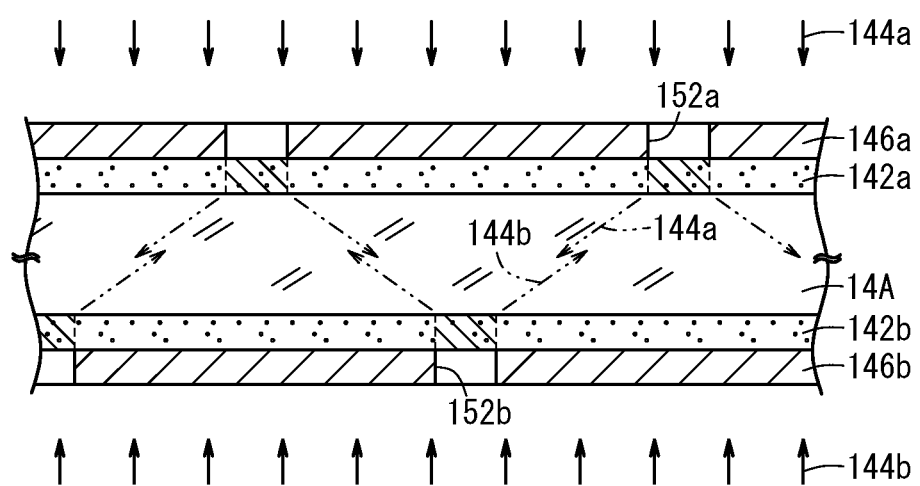
FIG. 12 is an explanatory view for illustrating first and second exposure treatments performed such that a light incident on a first photosensitive layer does not reach a second photosensitive layer and a light incident on the second photosensitive layer does not reach the first photosensitive layer.

As shown in FIG. 12, in the first exposure treatment in the production method of this embodiment, for example, the first photomask 146a is placed in close contact with the first photosensitive layer 142a, the first light source 148a is arranged facing the first photomask 146a, and the first light 144a is emitted from the first light source 148a toward the first photomask 146a, so that the first photosensitive layer 142a is exposed. The first photomask 146a has a glass substrate composed of a transparent soda glass and a mask pattern (a first exposure pattern 152a) formed thereon. Therefore, in the first exposure treatment, areas in the first photosensitive layer 142a, corresponding to the first exposure pattern 152a in the first photomask 146a, are exposed. A space of approximately 2 to 10 μm may be formed between the first photosensitive layer 142a and the first photomask 146a.

Similarly, in the second exposure treatment, for example, the second photomask 146b is placed in close contact with the second photosensitive layer 142b, the second light source 148b is arranged facing the second photomask 146b, and the second light 144b is emitted from the second light source 148b toward the second photomask 146b, so that the second photosensitive layer 142b is exposed. The second photomask 146b, as well as the first photomask 146a, has a glass substrate composed of a transparent soda glass and a mask pattern (a second exposure pattern 152b) formed thereon. Therefore, in the second exposure treatment, areas in the second photosensitive layer 142b, corresponding to the second exposure pattern 152b in the second photomask 146b, are exposed. In this case, a space of approximately 2 to 10 μm may be formed between the second photosensitive layer 142b and the second photomask 146b.

In the first and second exposure treatments, the emission of the first light 144a from the first light source 148a and the emission of the second light 144b from the second light source 148b may be carried out simultaneously or independently. When the emissions are simultaneously carried out, the first photosensitive layer 142a and the second photosensitive layer 142b can be simultaneously exposed in one exposure process to reduce the treatment time.

In a case where both of the first photosensitive layer 142a and the second photosensitive layer 142b are not spectrally sensitized, a light incident on one side may affect the image formation on the other side (the back side) in the both-side exposure of the photosensitive material 140.

Thus, the first light 144a from the first light source 148a reaches the first photosensitive layer 142a and is scattered by silver halide particles in the first photosensitive layer 142a, and a part of the scattered light is transmitted through the first transparent substrate 14A and reaches the second photosensitive layer 142b. Then, a large area of the boundary between the second photosensitive layer 142b and the first transparent substrate 14A is exposed to form a latent image. As a result, the second photosensitive layer 142b is exposed to the second light 144b from the second light source 148b and the first light 144a from the first light source 148a. When the second photosensitive layer 142b is developed to prepare the conductive sheet stack 12, the conductive pattern corresponding to the second exposure pattern 152b (the second conductive part 16B) is formed, and additionally a thin conductive layer is formed due to the first light 144a from the first light source 148a between the conductive pattern, so that the desired pattern (corresponding to the second exposure pattern 152b) cannot be obtained. This is true also for the first photosensitive layer 142a.

As a result of intense research in view of solving this problem, it has been found that when the thicknesses and the applied silver amounts of the first photosensitive layer 142a and the second photosensitive layer 142b are selected within particular ranges, the incident light can be absorbed by the silver halide to suppress the light transmission to the back side. In this embodiment, the thicknesses of the first photosensitive layer 142a and the second photosensitive layer 142b may be 1 μm or more and 4 μm or less. The upper limit is preferably 2.5 μm. The applied silver amounts of the first photosensitive layer 142a and the second photosensitive layer 142b may be 5 to 20 g/m$^2$.

In the above-described, both-side contact exposure technology, the exposure may be inhibited by dust or the like attached to the film surface to generate an image defect. It is known that the dust attachment can be prevented by applying a conductive substance such as a metal oxide or a conductive polymer to the film. However, the metal oxide or the like remains in the processed product, deteriorating the transparency of the final product. Also, and the conductive polymer is disadvantageous in storage stability, etc. As a result of intense research, it has been found that a silver halide layer with a reduced binder content exhibits a satisfactory conductivity for static charge prevention. Thus, the volume ratio of silver/binder is controlled in the first photosensitive layer 142a and the second photosensitive layer 142b. The silver/binder volume ratios of the first photosensitive layer 142a and the second photosensitive layer 142b are 1/1 or more, preferably 2/1 or more.

In a case where the thicknesses, the applied silver amounts, and the silver/binder volume ratios of the first photosensitive layer 142a and the second photosensitive layer 142b are selected as described above, as shown in FIG. 12, the first light 144a emitted from the first light source 148a to the first photosensitive layer 142a does not reach the second photosensitive layer 142b. Similarly, the second light 144b emitted from the second light source 148b to the second photosensitive layer 142b does not reach the first photosensitive layer 142a. As a result, in the following development for producing the conductive sheet stack 12, as shown in FIG. 3B, only the conductive pattern corresponding to the first exposure pattern 152a (the pattern of the first conductive part 16A) is formed on the one main surface of the first transparent substrate 14A, and only the conductive pattern corresponding to the second exposure pattern 152b (the pattern of the second conductive part 16B) is formed on the other main surface of the first transparent substrate 14A, so that the desired patterns can be obtained.

In the production method using the above one-shot both-side exposure, the first photosensitive layer 142a and the second photosensitive layer 142b can have both of the satisfactory conductivity and both-side exposure suitability, and the same or different patterns can be formed on the surfaces of the one first transparent substrate 14A by the exposure, whereby the electrodes of the touch panel 100 can be easily formed, and the touch panel 100 can be made thinner (smaller).

In the above production method, the first conductive part 16A and the second conductive part 16B are formed using the photosensitive silver halide emulsion layers. The other production methods include the following methods.

A photosensitive plating base layer containing a pre-plating treatment material may be formed on the first transparent substrate 14A or the second transparent substrate 14B. The resultant layer may be exposed and developed, and may be subjected to a plating treatment, whereby metal portions and light-transmitting portions may be formed in the exposed areas and the unexposed areas respectively to form the first conductive part 16A and the second conductive part 16B. The metal portions may be further subjected to a physical development treatment and/or a plating treatment to deposit a conductive metal thereon.

The following two processes can be preferably used in the method using the pre-plating treatment material. The processes are disclosed more specifically in Japanese Laid-Open Patent Publication Nos. 2003-213437, 2006-64923, 2006-58797, and 2006-135271, etc.

(a) A process comprising applying, to a transparent substrate, a plating base layer having a functional group interactable with a plating catalyst or a precursor thereof, exposing and developing the layer, and subjecting the developed layer to a plating treatment to form a metal portion on the plating base material.

(b) A process comprising applying, to a transparent substrate, an underlayer containing a polymer and a metal oxide and a plating base layer having a functional group interactable with a plating catalyst or a precursor thereof in this order, exposing and developing the layers, and subjecting the developed layers to a plating treatment to form a metal portion on the plating base material.

Alternatively, a photoresist film on a copper foil disposed on the first transparent substrate 14A or the second transparent substrate 14B may be exposed and developed to form a resist pattern, and the copper foil exposed from the resist pattern may be etched to form the first conductive part 16A or the second conductive part 16B.

A paste containing fine metal particles may be printed on the first transparent substrate 14A or the second transparent substrate 14B, and the printed paste may be plated with a metal to form the first conductive part 16A or the second conductive part 16B.

The first conductive part 16A or the second conductive part 16B may be printed on the first transparent substrate 14A or the second transparent substrate 14B by using a screen or gravure printing plate.

The first conductive part 16A or the second conductive part 16B may be formed on the first transparent substrate 14A or the second transparent substrate 14B by using an inkjet method.

A particularly preferred method, which contains using a photographic photosensitive silver halide material for producing the first conductive sheet 10A or the second conductive sheet 10B of this embodiment, will be mainly described below.

The method for producing the first conductive sheet 10A or the second conductive sheet 10B of this embodiment includes the following three processes different in the photosensitive materials and development treatments.

(1) A process comprising subjecting a photosensitive black-and-white silver halide material free of physical development nuclei to a chemical or thermal development to form the metallic silver portions on the photosensitive material.

(2) A process comprising subjecting a photosensitive black-and-white silver halide material having a silver halide emulsion layer containing physical development nuclei to a solution physical development to form the metallic silver portions on the photosensitive material.

(3) A process comprising subjecting a stack of a photosensitive black-and-white silver halide material free of physical development nuclei and an image-receiving sheet having a non-photosensitive layer containing physical development nuclei to a diffusion transfer development to form the metallic silver portions on the non-photosensitive image-receiving sheet.

In the process of (1), an integral black-and-white development procedure is used to form a transmittable conductive film such as a light-transmitting conductive film on the photosensitive material. The resulting silver is a chemically or thermally developed silver in the state of a high-specific surface area filament, and thereby shows a high activity in the following plating or physical development treatment.

In the process of (2), the silver halide particles are melted around and deposited on the physical development nuclei in the exposed areas to form a transmittable conductive film such as a light-transmitting conductive film on the photosensitive material. Also in this process, an integral black-and-white development procedure is used. Though high activity can be achieved since the silver halide is deposited on the physical development nuclei in the development, the developed silver has a spherical shape with small specific surface.

In the process of (3), the silver halide particles are melted in the unexposed areas, and are diffused and deposited on the development nuclei of the image-receiving sheet, to form a transmittable conductive film such as a light-transmitting conductive film on the sheet. In this process, a so-called separate-type procedure is used, the image-receiving sheet being peeled off from the photosensitive material.

A negative or reversal development treatment can be used in the processes. In the diffusion transfer development, the negative development treatment can be carried out using an auto-positive photosensitive material.

The chemical development, thermal development, solution physical development, and diffusion transfer development have the meanings generally known in the art, and are explained in common photographic chemistry texts such as Shin-ichi Kikuchi, "*Shashin Kagaku (Photographic Chemistry)*", Kyoritsu Shuppan Co., Ltd., 1955 and C. E. K. Mees, "*The Theory of Photographic Processes, 4th ed.*", Mcmillan, 1977. A liquid treatment is generally used in the present invention, and also a thermal development treatment can be utilized. For example, techniques described in Japanese Laid-Open Patent Publication Nos. 2004-184693, 2004-334077, and 2005-010752 and Japanese Patent Application Nos. 2004-244080 and 2004-085655 can be used in the present invention.

The structure of each layer in the first conductive sheet 10A and the second conductive sheet 10B of this embodiment will be described in detail below.

[First Transparent Substrate 14A and Second Transparent Substrate 14B]

The first transparent substrate 14A and the second transparent substrate 14B may be a plastic film, a plastic plate, a glass plate, etc.

Examples of materials for the plastic film and the plastic plate include polyesters such as polyethylene terephthalates (PET) and polyethylene naphthalates (PEN); polyolefins such as polyethylenes (PE), polypropylenes (PP), polystyrenes, and EVA; vinyl resins; polycarbonates (PC); polyamides; polyimides; acrylic resins; and triacetyl celluloses (TAC).

The first transparent substrate 14A and the second transparent substrate 14B are preferably a film or plate of a plastic having a melting point of about 290° C. or lower, such as PET (melting point 258° C.), PEN (melting point 269° C.), PE (melting point 135° C.), PP (melting point 163° C.), polystyrene (melting point 230° C.), polyvinyl chloride (melting point 180° C.), polyvinylidene chloride (melting point 212° C.), or TAC (melting point 290° C.). The PET is particularly preferred from the viewpoints of light transmittance, workability, etc. The conductive film such as the first conductive sheet 10A or the second conductive sheet 10B used in the conductive sheet stack 12 is required to be transparent, and therefore the first transparent substrate 14A and the second transparent substrate 14B preferably have a high transparency.

[Silver Salt Emulsion Layer]

The silver salt emulsion layer for forming the conductive portions of the first conductive sheet 10A and the second conductive sheet 10B (including the first conductive patterns 18A, the first auxiliary patterns 26A, the second conductive patterns 18B, and the second auxiliary patterns 26B) contains a silver salt and a binder and may further contain a solvent and an additive such as a dye.

The silver salt used in this embodiment may be an inorganic silver salt such as a silver halide or an organic silver salt such as silver acetate. In this embodiment, the silver halide is preferred because of its excellent light sensing property.

The applied silver amount (the amount of the applied silver salt in the silver density) of the silver salt emulsion layer is preferably 1 to 30 $g/m^2$, more preferably 1 to 25 $g/m^2$, further preferably 5 to 20 $g/m^2$. When the applied silver amount is within this range, the resultant conductive sheet stack 12 can exhibit a desired surface resistance.

Examples of the binders used in this embodiment include gelatins, polyvinyl alcohols (PVA), polyvinyl pyrolidones (PVP), polysaccharides such as starches, celluloses and derivatives thereof, polyethylene oxides, polyvinylamines, chitosans, polylysines, polyacrylic acids, polyalginic acids, polyhyaluronic acids, and carboxycelluloses. The binders show a neutral, anionic, or cationic property depending on the ionicity of a functional group.

In this embodiment, the amount of the binder in the silver salt emulsion layer is not particularly limited, and may be appropriately selected to obtain sufficient dispersion and adhesion properties. The volume ratio of silver/binder in the silver salt emulsion layer is preferably 1/4 or more, more preferably 1/2 or more. The silver/binder volume ratio is preferably 100/1 or less, more preferably 50/1 or less. Particularly, the silver/binder volume ratio is further preferably 1/1 to 4/1, most preferably 1/1 to 3/1. As long as the silver/binder volume ratio of the silver salt emulsion layer falls within this range, the resistance variation can be reduced even under various applied silver amount, whereby the conductive sheet stack can be produced with a uniform surface resistance. The silver/binder volume ratio can be obtained by converting the silver halide/binder weight ratio of the material to the silver/binder weight ratio, and by further converting the silver/binder weight ratio to the silver/binder volume ratio.

<Solvent>

The solvent used for forming the silver salt emulsion layer is not particularly limited, and examples thereof include water, organic solvents (e.g. alcohols such as methanol, ketones such as acetone, amides such as formamide, sulfoxides such as dimethyl sulfoxide, esters such as ethyl acetate, ethers), ionic liquids, and mixtures thereof.

In this embodiment, the ratio of the solvent to the total of the silver salt, the binder, and the like in the silver salt emulsion layer is 30% to 90% by mass, preferably 50% to 80% by mass.

<Other Additives>

The additives used in this embodiment are not particularly limited, and may be preferably selected from known additives.

[Other Layers]

A protective layer (not shown) may be formed on the silver salt emulsion layer. The protective layer used in this embodiment contains a binder such as a gelatin or a high-molecular polymer, and is disposed on the photosensitive silver salt emulsion layer to improve the scratch prevention or mechanical property. The thickness of the protective layer is preferably 0.5 µm or less. The method of applying or forming the protective layer is not particularly limited, and may be appropriately selected from known applying or forming methods. In addition, an undercoat layer or the like may be formed below the silver salt emulsion layer.

The steps for producing the first conductive sheet 10A and the second conductive sheet 10B will be described below.

[Exposure]

In this embodiment, the first conductive part 16A and the second conductive part 16B may be formed in a printing process, and may be formed by exposure and development treatments, etc. in another process. Thus, a photosensitive material having the first transparent substrate 14A or the second transparent substrate 14B and thereon the silver salt-containing layer or a photosensitive material coated with a photopolymer for photolithography is subjected to the exposure treatment. An electromagnetic wave may be used in the exposure. For example, the electromagnetic wave may be a light such as a visible light or an ultraviolet light, or a radiation ray such as an X-ray. The exposure may be carried out using a light source having a wavelength distribution or a specific wavelength.

[Development Treatment]

In this embodiment, the emulsion layer is subjected to the development treatment after the exposure. Common development treatment technologies for photographic silver salt films, photographic papers, print engraving films, emulsion masks for photomasking, and the like may be used in the present invention. The developer used in the development treatment is not particularly limited, and may be a PQ developer, an MQ developer, an MAA developer, etc. Examples of commercially available developers usable in the present invention include CN-16, CR-56, CP45X, FD-3, and PAP-ITOL available from FUJIFILM Corporation, C-41, E-6, RA-4, D-19, and D-72 available from Eastman Kodak Company, and developers contained in kits thereof. The developer may be a lith developer.

In the present invention, the development process may include a fixation treatment for removing the silver salt in the unexposed areas to stabilize the material. Fixation treatment technologies for photographic silver salt films, photographic papers, print engraving films, emulsion masks for photomasking, and the like may be used in the present invention.

In the fixation treatment, the fixation temperature is preferably about 20° C. to 50° C., more preferably 25° C. to 45° C. The fixation time is preferably 5 seconds to 1 minute, more preferably 7 to 50 seconds. The amount of the fixer used is preferably 600 ml/m$^2$ or less, more preferably 500 ml/m$^2$ or less, particularly preferably 300 ml/m$^2$ or less, per 1 m$^2$ of the photosensitive material treated.

The developed and fixed photosensitive material is preferably subjected to a water washing treatment or a stabilization treatment. The amount of water used in the water washing or stabilization treatment is generally 20 L or less, and may be 3 L or less, per 1 m$^2$ of the photosensitive material. The water amount may be 0, and thus the photosensitive material may be washed with storage water.

The ratio of the metallic silver contained in the exposed areas after the development to the silver contained in the areas before the exposure is preferably 50% or more, more preferably 80% or more by mass. When the ratio is 50% or more by mass, a high conductivity can be achieved.

In this embodiment, the tone (gradation) obtained by the development is preferably more than 4.0, though not particularly restrictive. When the tone is more than 4.0 after the development, the conductivity of the conductive metal portion can be increased while maintaining the high transmittance of the light-transmitting portion. For example, the tone of 4.0 or more can be obtained by doping with rhodium or iridium ion.

The conductive sheet is obtained by the above steps. The surface resistance of the resultant first conductive sheet 10A or second conductive sheet 10B is preferably within a range of 0.1 to 100 ohm/sq. The lower limit is preferably 1 ohm/sq or more, 3 ohm/sq or more, 5 ohm/sq or more, or 10 ohm/sq or more. The upper limit is preferably 70 ohm/sq or less or 50 ohm/sq or less. When the surface resistance is controlled within this range, the position detection can be performed even in a large touch panel having an area of 10 cm×10 cm or more. The first conductive sheet 10A and the second conductive sheet 10B may be subjected to a calender treatment after the development treatment to obtain a desired surface resistance.

[Physical Development Treatment and Plating Treatment]

In this embodiment, to increase the conductivity of the metallic silver portion formed by the above exposure and development treatments, conductive metal particles may be deposited thereon by a physical development treatment and/or a plating treatment. In the present invention, the conductive metal particles may be deposited on the metallic silver portion by only one of the physical development and plating treatments or by the combination of the treatments. The metallic silver portion, subjected to the physical development treatment and/or the plating treatment in this manner, is also referred to as the conductive metal portion.

In this embodiment, the physical development is such a process that metal ions such as silver ions are reduced by a reducing agent, whereby metal particles are deposited on a metal or metal compound core. Such physical development has been used in the fields of instant B & W film, instant slide film, printing plate production, etc., and the technologies can be used in the present invention.

The physical development may be carried out at the same time as the above development treatment after the exposure, and may be carried out after the development treatment separately.

In this embodiment, the plating treatment may contain electroless plating (such as chemical reduction plating or displacement plating), electrolytic plating, or a combination thereof. Known electroless plating technologies for printed circuit boards, etc. may be used in this embodiment. The electroless plating is preferably electroless copper plating.

[Oxidation Treatment]

In this embodiment, the metallic silver portion formed by the development treatment or the conductive metal portion formed by the physical development treatment and/or the plating treatment is preferably subjected to an oxidation treatment. For example, by the oxidation treatment, a small amount of a metal deposited on the light-transmitting portion can be removed, so that the transmittance of the light-transmitting portion can be increased to approximately 100%.

[Conductive Metal Portion]

In this embodiment, the lower limit of the line width of the conductive metal portion (the thin metal wire 20) may be 0.1 µm or more as described above. The lower limit of the line width is preferably 1 µm or more, 3 µm or more, 4 µm or more, or 5 µm or more, and the upper limit thereof is preferably 15

μm or less, 10 μm or less, 9 μm or less, or 8 μm or less. When the line width is less than the lower limit, the conductive metal portion has an insufficient conductivity, whereby a touch panel using the portion has insufficient detection sensitivity. On the other hand, when the line width is more than the upper limit, moire is significantly generated due to the conductive metal portion, and a touch panel using the portion has a poor visibility. As long as the line width falls within the above range, the moire of the conductive metal portion is improved, and the visibility is remarkably improved. The side length of the first lattice 22a is preferably 30 μm or more and 500 μm or less, more preferably 50 μm or more and 400 μm or less, most preferably 100 μm or more and 350 μm or less. The conductive metal portion may have a part with a line width of more than 200 μm for the purpose of ground connection, etc.

In this embodiment, the opening ratio of the conductive metal portion is preferably 85% or more, more preferably 90% or more, most preferably 95% or more, in view of the visible light transmittance. The opening ratio is the ratio of the light-transmitting portions other than the conductive portions (including the first conductive patterns, the first auxiliary patterns, the second conductive patterns, and the second auxiliary patterns) to the entire conductive part. For example, a square lattice having a line width of 15 μm and a pitch of 300 μm has an opening ratio of 90%.

[Light-Transmitting Portion]

In this embodiment, the light-transmitting portion is a portion having light transmittance, other than the conductive metal portions in the first conductive sheet 10A and the second conductive sheet 10B. The transmittance of the light-transmitting portion, which is herein a minimum transmittance value in a wavelength region of 380 to 780 nm obtained neglecting the light absorption and reflection of the first transparent substrate 14A and the second transparent substrate 14B, is 90% or more, preferably 95% or more, more preferably 97% or more, further preferably 98% or more, most preferably 99% or more.

The exposure is preferably carried out using a glass mask method or a laser lithography pattern exposure method.

[First Conductive Sheet 10A and Second Conductive Sheet 10B]

In the first conductive sheet 10A and the second conductive sheet 10B of this embodiment, the thicknesses of the first transparent substrate 14A and the second transparent substrate 14B are preferably 50 to 350 μm, more preferably 80 to 250 μm, particularly preferably 100 to 200 μm. When the thicknesses are within the range of 50 to 350 μm, a desired visible light transmittance can be obtained, the substrates can be easily handled, and the parasitic capacitance between the first conductive patterns 18A and the second conductive patterns 18B can be lowered.

The thickness of the metallic silver portion formed on the first transparent substrate 14A or the second transparent substrate 14B may be appropriately selected by controlling the thickness of the coating liquid for the silver salt-containing layer applied to the first transparent substrate 14A or the second transparent substrate 14B. The thickness of the metallic silver portion may be selected within a range of 0.001 to 0.2 mm, and is preferably 30 μm or less, more preferably 20 μm or less, further preferably 0.01 to 9 μm, most preferably 0.05 to 5 μm. The metallic silver portion is preferably formed in a patterned shape. The metallic silver portion may have a monolayer structure or a multilayer structure containing two or more layers. When the metallic silver portion has a patterned multilayer structure containing two or more layers, the layers may have different wavelength color sensitivities. In this case, different patterns can be formed in the layers by using exposure lights with different wavelengths.

In the case of using the first conductive sheet 10A or the second conductive sheet 10B in a touch panel, the conductive metal portion preferably has a smaller thickness. As the thickness is reduced, the viewing angle and visibility of the display panel are improved. Thus, the thickness of the layer of the conductive metal on the conductive metal portion is preferably less than 9 μm, more preferably 0.1 μm or more but less than 5 μm, further preferably 0.1 μm or more but less than 3 μm.

In this embodiment, the thickness of the metallic silver portion can be controlled by changing the coating thickness of the silver salt-containing layer, and the thickness of the conductive metal particle layer can be controlled in the physical development treatment and/or the plating treatment, whereby the first conductive sheet 10A and the second conductive sheet 10B having a thickness of less than 5 μm (preferably less than 3 μm) can be easily produced.

The plating or the like is not necessarily carried out in the method for producing the first conductive sheet 10A and the second conductive sheet 10B of this embodiment. This is because the desired surface resistance can be obtained by controlling the applied silver amount and the silver/binder volume ratio of the silver salt emulsion layer in the method. The calender treatment or the like may be carried out if necessary.

(Film Hardening Treatment after Development Treatment)

It is preferred that after the silver salt emulsion layer is developed, the resultant is immersed in a hardener and thus subjected to a film hardening treatment. Examples of the hardeners include dialdehydes (such as glutaraldehyde, adipaldehyde, and 2,3-dihydroxy-1,4-dioxane) and boric acid, described in Japanese Laid-Open Patent Publication No. 02-141279.

[Conductive Sheet Stack]

An additional functional layer such as an antireflection layer or a hard coat layer may be formed in the conductive sheet stack 12.

The present invention may be appropriately combined with technologies described in the following patent publications and international patent pamphlets shown in Tables 1 and 2. "Japanese Laid-Open Patent", "Publication No.", "Pamphlet No.", etc. are omitted.

TABLE 1

| | | | | |
|---|---|---|---|---|
| 2004-221564 | 2004-221565 | 2007-200922 | 2006-352073 | 2007-129205 |
| 2007-235115 | 2007-207987 | 2006-012935 | 2006-010795 | 2006-228469 |
| 2006-332459 | 2009-21153 | 2007-226215 | 2006-261315 | 2007-072171 |
| 2007-102200 | 2006-228473 | 2006-269795 | 2006-269795 | 2006-324203 |
| 2006-228478 | 2006-228836 | 2007-009326 | 2006-336090 | 2006-336099 |
| 2006-348351 | 2007-270321 | 2007-270322 | 2007-201378 | 2007-335729 |
| 2007-134439 | 2007-149760 | 2007-208133 | 2007-178915 | 2007-334325 |
| 2007-310091 | 2007-116137 | 2007-088219 | 2007-207883 | 2007-013130 |
| 2005-302508 | 2008-218784 | 2008-227350 | 2008-227351 | 2008-244067 |
| 2008-267814 | 2008-270405 | 2008-277675 | 2008-277676 | 2008-282840 |
| 2008-283029 | 2008-288305 | 2008-288419 | 2008-300720 | 2008-300721 |
| 2009-4213 | 2009-10001 | 2009-16526 | 2009-21334 | 2009-26933 |
| 2008-147507 | 2008-159770 | 2008-159771 | 2008-171568 | 2008-198388 |
| 2008-218096 | 2008-218264 | 2008-224916 | 2008-235224 | 2008-235467 |
| 2008-241987 | 2008-251274 | 2008-251275 | 2008-252046 | 2008-277428 |

TABLE 2

| | | | | |
|---|---|---|---|---|
| 2006/001461 | 2006/088059 | 2006/098333 | 2006/098336 | 2006/098338 |
| 2006/098335 | 2006/098334 | 2007/001008 | | |

EXAMPLES

The present invention will be described more specifically below with reference to Examples. Materials, amounts, ratios, treatment contents, treatment procedures, and the like, used in Examples, may be appropriately changed without departing from the scope of the present invention. The following specific examples are therefore to be considered in all respects as illustrative and not restrictive.

First Example

In First Example, in each of the conductive sheet stacks 12 of Examples 1 to 9, the side length of the first lattice 22a, the line width of the thin metal wire 20, and the surface resistance of the representative second conductive pattern 18B were measured, and the moire and visibility were evaluated. The properties and evaluation results of Examples 1 to 9 are shown in Table 3.

Examples 1 to 9

Photosensitive Silver Halide Material

An emulsion containing an aqueous medium, a gelatin, and silver iodobromochloride particles was prepared. The amount of the gelatin was 10.0 g per 150 g of Ag, and the silver iodobromochloride particles had an I content of 0.2 mol %, a Br content of 40 mol %, and an average spherical equivalent diameter of 0.1 μm.

$K_3Rh_2Br_9$ and $K_2IrCl_6$ were added to the emulsion at a concentration of $10^{-7}$ (mol/mol-silver) to dope the silver bromide particles with Rh and Ir ions. $Na_2PdCl_4$ was further added to the emulsion, and the resultant emulsion was subjected to gold-sulfur sensitization using chlorauric acid and sodium thiosulfate. The emulsion and a gelatin hardening agent were applied to the first transparent substrate 14A or the second transparent substrate 14B having a thickness of 150 μm, both composed of a polyethylene terephthalate (PET). The amount of the applied silver was 10 g/m², and the Ag/gelatin volume ratio was 2/1.

The PET support had a width of 30 cm, and the emulsion was applied thereto into a width of 25 cm and a length of 20 m. The both end portions having a width of 3 cm were cut off to obtain a roll photosensitive silver halide material having a width of 24 cm.

(Exposure)

An A4 (210 mm×297 mm) sized area of the first transparent substrate 14A was exposed in the pattern of the first conductive sheet 10A shown in FIG. 4, and an A4 sized area of the second transparent substrate 14B was exposed in the pattern of the second conductive sheet 10B shown in FIG. 5. The exposure was carried out using a parallel light from a light source of a high-pressure mercury lamp and patterned photomasks.

(Development Treatment)

| Formulation of 1 L of developer | |
|---|---|
| Hydroquinone | 20 g |
| Sodium sulfite | 50 g |
| Potassium carbonate | 40 g |
| Ethylenediaminetetraacetic acid | 2 g |
| Potassium bromide | 3 g |
| Polyethylene glycol 2000 | 1 g |
| Potassium hydroxide | 4 g |
| pH | Controlled at 10.3 |
| Formulation of 1 L of fixer | |
| Ammonium thiosulfate solution (75%) | 300 ml |
| Ammonium sulfite monohydrate | 25 g |
| 1,3-Diaminopropanetetraacetic acid | 8 g |
| Acetic acid | 5 g |
| Aqueous ammonia (27%) | 1 g |
| pH | Controlled at 6.2 |

The exposed photosensitive material was treated with the above treatment agents using an automatic processor FG-710PTS manufactured by FUJIFILM Corporation under the following conditions. A development treatment was carried out at 35° C. for 30 seconds, a fixation treatment was carried out at 34° C. for 23 seconds, and then a water washing treatment was carried out for 20 seconds at a water flow rate of 5 L/min.

Example 1

In the conductive parts (including the first conductive patterns 18A and the second conductive patterns 18B) of the prepared first conductive sheet 10A and second conductive sheet 10B, the side length of the first lattice 22a was 30 μm (i.e. the side length of the second lattice 22b was 60 μm) and the line width of the thin metal wire 20 was 1 μm.

Example 2

The first conductive sheet 10A and the second conductive sheet 10B of Example 2 were produced in the same manner as Example 1 except that the side length of the first lattice 22a was 40 μm (i.e. the side length of the second lattice 22b was 80 μm) and the line width of the thin metal wire 20 was 3 μm.

Example 3

The first conductive sheet 10A and the second conductive sheet 10B of Example 3 were produced in the same manner as Example 1 except that the side length of the first lattice 22a was 50 μm (i.e. the side length of the second lattice 22b was 100 μm) and the line width of the thin metal wire 20 was 4 μm.

Example 4

The first conductive sheet 10A and the second conductive sheet 10B of Example 4 were produced in the same manner as Example 1 except that the side length of the first lattice 22a was 80 μm (i.e. the side length of the second lattice 22b was 160 μm) and the line width of the thin metal wire 20 was 5 μm.

Example 5

The first conductive sheet 10A and the second conductive sheet 10B of Example 5 were produced in the same manner as Example 1 except that the side length of the first lattice 22a was 100 μm (i.e. the side length of the second lattice 22b was 200 μm) and the line width of the thin metal wire 20 was 8 μm.

Example 6

The first conductive sheet 10A and the second conductive sheet 10B of Example 6 were produced in the same manner as Example 1 except that the side length of the first lattice 22a was 250 μm (i.e. the side length of the second lattice 22b was 500 μm) and the line width of the thin metal wire 20 was 9 μm.

Example 7

The first conductive sheet 10A and the second conductive sheet 10B of Example 7 were produced in the same manner as Example 1 except that the side length of the first lattice 22a was 350 μm (i.e. the side length of the second lattice 22b was 700 μm) and the line width of the thin metal wire 20 was 10 μm.

Example 8

The first conductive sheet 10A and the second conductive sheet 10B of Example 8 were produced in the same manner as Example 1 except that the side length of the first lattice 22*a* was 400 μm (i.e. the side length of the second lattice 22*b* was 800 μm) and the line width of the thin metal wire 20 was 15 μm.

Example 9

The first conductive sheet 10A and the second conductive sheet 10B of Example 9 were produced in the same manner as Example 1 except that the side length of the first lattice 22*a* was 500 μm (i.e. the side length of the second lattice 22*b* was 1000 μm) and the line width of the thin metal wire 20 was 15 μm.

(Surface Resistance Measurement)

In each of the first conductive sheets 10A and the second conductive sheets 10B, the surface resistivity values of optionally selected 10 points were measured by LORESTA GP (Model No. MCP-T610) manufactured by Dia Instruments Co., Ltd. utilizing an in-line four-probe method (ASP), and the average of the measured values was obtained to evaluate the detection accuracy.

(Transmittance Measurement)

In each of the first conductive sheets 10A and the second conductive sheets 10B, the transmittance value of the light-transmitting portion was measured by a spectrophotometer to evaluate the transparency of the first transparent substrate 14A.

(Moire Evaluation)

In Examples 1 to 9, the first conductive sheet 10A was stacked on the second conductive sheet 10B to prepare the conductive sheet stack 12, and the conductive sheet stack 12 was attached to the display screen of the display device 108 (liquid crystal display) to produce the touch panel 100. The touch panel 100 was fixed to a turntable, and the display device 108 was operated to display a white color. The moire of the conductive sheet stack 12 was visually observed and evaluated while turning the turntable within a bias angle range of −45° to +45°.

The moire was observed at a distance of 1.5 m from the display screen 110*a* of the display device 108. The conductive sheet stack 12 was evaluated as "Good" when the moire was not visible, as "Fair" when the moire was slightly visible to an acceptable extent, or as "Poor" when the moire was highly visible.

(Visibility Evaluation)

Before the moire evaluation, the touch panel 100 was fixed to the turntable, the display device 108 was operated to display the white color, and whether a thickened line or a black point was formed or not in the touch panel 100 and whether boundaries between the first conductive patterns 18A and the second conductive patterns 18B and between the first electrodes 24A and the second electrodes 24B were visible or not in the touch panel 100 were evaluated by the naked eye.

As shown in Table 3, among Examples 1 to 9, the conductive sheet stacks 12 of Examples 1 to 8 had excellent conductivity, transmittance, moire, and visibility properties. The conductive sheet stack 12 of Example 9 was inferior to those of Examples 1 to 8 in the moire and visibility properties. However, in Example 9, the moire was only slightly visible to an acceptable extent, and an image on the display device 108 could be observed without any difficulty.

Therefore, it is clear that the side length of the first lattice 22*a* is preferably 30 to 500 μm, more preferably 50 to 400 μm, particularly preferably 100 to 350 μm. Furthermore, it is clear that the lower limit of the line width of the thin metal wire 20 is preferably 1 μm or more, 3 μm or more, 4 μm or more, or 5 μm or more, and the upper limit is preferably 15 μm or less, 10 μm or less, 9 μm or less, or 8 μm or less.

Second Example

In Second Example, in the conductive sheet stacks 12 of Examples 11 to 17 and Reference Examples 11 and 12, the thickness of the first transparent substrate 14A was changed to evaluate the detection sensitivity and the visibility. The properties and evaluation results of Examples 11 to 17 and Reference Examples 11 and 12 are shown in Table 4.

Example 11

The first conductive sheet 10A and the second conductive sheet 10B of Example 11 were produced in the same manner as Example 1 except that, in the conductive parts (including the first conductive patterns 18A and the second conductive patterns 18B), the side length of the first lattice 22*a* was 80 μm (i.e. the side length of the second lattice 22*b* was 160 μm), the line width of the thin metal wire 20 was 5 μm, and the thickness of the first transparent substrate 14A was 50 μm.

Example 12

The first conductive sheet 10A and the second conductive sheet 10B of Example 12 were produced in the same manner as Example 11 except that the thickness of the first transparent substrate 14A was 80 μm.

Example 13

The first conductive sheet 10A and the second conductive sheet 10B of Example 13 were produced in the same manner as Example 11 except that the thickness of the first transparent substrate 14A was 100 μm.

Example 14

The first conductive sheet 10A and the second conductive sheet 10B of Example 14 were produced in the same manner as Example 11 except that the thickness of the first transparent substrate 14A was 150 μm.

TABLE 3

|  | Side length of first lattice (μm) | Line width of thin metal wire (μm) | Thickness of transparent substrate (μm) | Surface resistance (Ω/sq) | Moire evaluation | Visibility evaluation |
|---|---|---|---|---|---|---|
| Example 1 | 30 | 1 | 150 | 90 | Good | Good |
| Example 2 | 40 | 3 | 150 | 85 | Good | Good |
| Example 3 | 50 | 4 | 150 | 80 | Good | Good |
| Example 4 | 80 | 5 | 150 | 75 | Good | Good |
| Example 5 | 100 | 8 | 150 | 65 | Good | Good |
| Example 6 | 250 | 9 | 150 | 50 | Good | Good |
| Example 7 | 350 | 10 | 150 | 45 | Good | Good |
| Example 8 | 400 | 15 | 150 | 40 | Good | Good |
| Example 9 | 500 | 15 | 150 | 40 | Fair | Fair |

Example 15

The first conductive sheet 10A and the second conductive sheet 10B of Example 15 were produced in the same manner as Example 11 except that the thickness of the first transparent substrate 14A was 200 μm.

Example 16

The first conductive sheet 10A and the second conductive sheet 10B of Example 16 were produced in the same manner as Example 11 except that the thickness of the first transparent substrate 14A was 250 μm.

Example 17

The first conductive sheet 10A and the second conductive sheet 10B of Example 17 were produced in the same manner as Example 11 except that the thickness of the first transparent substrate 14A was 350 μm.

Reference Example 11

The first conductive sheet 10A and the second conductive sheet 10B of Reference Example 11 were produced in the same manner as Example 11 except that the thickness of the first transparent substrate 14A was 30 μm.

Reference Example 12

The first conductive sheet 10A and the second conductive sheet 10B of Reference Example 12 were produced in the same manner as Example 11 except that the thickness of the first transparent substrate 14A was 400 μm.

(Detection Sensitivity Evaluation)

A finger was moved in a predetermined direction on each touch panel 100 to obtain a detection waveform. The detection sensitivity was evaluated based on the detection waveform. The touch panel 100 was evaluated as "Excellent" when the detection sensitivity was more than 110% of a predetermined threshold value, as "Good" when it was 90% or more and 110% or less of the threshold value, or as "Fair" when it was less than 90% of the threshold value.

The results of Examples 11 to 17 and Reference Examples 11 and 12 are shown in Table 4.

patterns 18A and the second conductive patterns 18B, and the detection sensitivity was deteriorated due to the parasitic capacitance. The conductive sheet stack 12 of Reference Example 12 was poor in both of the detection sensitivity and the visibility. It was likely that because the first transparent substrate 14A had a remarkably large thickness of 400 μm, the finger touch position was hardly detected by the second conductive patterns 18B in the self capacitance technology, and signals from the second electrodes 24B (the drive electrodes) were hardly received by the first electrodes 24A (the receiving electrodes) in the mutual capacitance technology. The visibility was deteriorated because the first transparent substrate 14A had a remarkably large thickness of 400 μm, whereby the light-transmitting portions had a low transmittance of 80% to lower the transparency.

In contrast, the conductive sheet stacks 12 of Examples 11 to 17 had high detection sensitivities and high visibilities. Particularly the conductive sheet stacks 12 of Examples 13 to 15 had excellent detection sensitivities.

Therefore, it is clear that the thickness of the transparent substrate (the first transparent substrate 14A) disposed between the first conductive part 16A and the second conductive part 16B is preferably 50 μm or more and 350 μm or less, further preferably 80 μm or more and 250 μm or less, particularly preferably 100 μm or more and 200 μm or less.

Third Example

In Third Example, in the conductive sheet stacks 12 of Examples 21 to 29 and Reference Examples 21 and 22, the ratio (A2/A1) of the occupation area A2 of the second conductive patterns 18B to the occupation area A1 of the first conductive patterns 18A was changed to evaluate the surface resistance of the first conductive pattern 18A, the surface resistance of the second conductive pattern 18B, and the detection sensitivity. The properties and evaluation results of Examples 21 to 29 and Reference Examples 21 and 22 are shown in Table 5.

Example 21

The first conductive sheet 10A and the second conductive sheet 10B of Example 21 were produced in the same manner as Example 1 except that, in the conductive parts (including the first conductive patterns 18A and the second conductive

TABLE 4

| | Side length of first lattice (μm) | Line width of thin metal wire (μm) | Thickness of transparent substrate (μm) | Transmittance of light-transmitting portion (%) | Detection sensitivity | Visibility evaluation |
|---|---|---|---|---|---|---|
| Reference Example 11 | 80 | 5 | 30 | 99 | Fair | Good |
| Example 11 | 80 | 5 | 50 | 99 | Good | Good |
| Example 12 | 80 | 5 | 80 | 99 | Good | Good |
| Example 13 | 80 | 5 | 100 | 97 | Excellent | Good |
| Example 14 | 80 | 5 | 150 | 97 | Excellent | Good |
| Example 15 | 80 | 5 | 200 | 95 | Excellent | Good |
| Example 16 | 80 | 5 | 250 | 95 | Good | Good |
| Example 17 | 80 | 5 | 350 | 90 | Good | Good |
| Reference Example 12 | 80 | 5 | 400 | 80 | Poor | Poor |

As shown in Table 4, though the conductive sheet stack 12 of Reference Example 11 had a good visibility, it had a low detection sensitivity. It was likely that because the first transparent substrate 14A had a small thickness of 30 μm, a large parasitic capacitance was formed between the first conductive patterns 18B), the side length of the first lattice 22a was 80 μm (i.e. the side length of the second lattice 22b was 160 μm), the line width of the thin metal wire 20 was 5 μm, the thickness of the first transparent substrate 14A was 150 μm, and the occupation area ratio A2/A1 was 2.

Example 22

The first conductive sheet 10A and the second conductive sheet 10B of Example 22 were produced in the same manner as Example 21 except that the occupation area ratio A2/A1 was 3.

Example 23

The first conductive sheet 10A and the second conductive sheet 10B of Example 23 were produced in the same manner as Example 21 except that the occupation area ratio A2/A1 was 3.3.

Example 24

The first conductive sheet 10A and the second conductive sheet 10B of Example 24 were produced in the same manner as Example 21 except that the occupation area ratio A2/A1 was 5.

Example 25

The first conductive sheet 10A and the second conductive sheet 10B of Example 25 were produced in the same manner as Example 21 except that the occupation area ratio A2/A1 was 7.

Example 26

The first conductive sheet 10A and the second conductive sheet 10B of Example 26 were produced in the same manner as Example 21 except that the occupation area ratio A2/A1 was 8.

Example 27

The first conductive sheet 10A and the second conductive sheet 10B of Example 27 were produced in the same manner as Example 21 except that the occupation area ratio A2/A1 was 10.

Example 28

The first conductive sheet 10A and the second conductive sheet 10B of Example 28 were produced in the same manner as Example 21 except that the occupation area ratio A2/A1 was 15.

Example 29

The first conductive sheet 10A and the second conductive sheet 10B of Example 29 were produced in the same manner as Example 21 except that the occupation area ratio A2/A1 was 20.

Reference Example 21

The first conductive sheet 10A and the second conductive sheet 10B of Reference Example 21 were produced in the same manner as Example 21 except that the occupation area ratio A2/A1 was 1.

Reference Example 22

The first conductive sheet 10A and the second conductive sheet 10B of Reference Example 22 were produced in the same manner as Example 21 except that the occupation area ratio A2/A1 was 25.

TABLE 5

| | Occupation area ratio (A2/A1) of conductive patterns | Surface resistance of first conductive pattern ($\Omega$/sq) | Surface resistance of second conductive pattern ($\Omega$/sq) | Detection sensitivity |
|---|---|---|---|---|
| Reference Example 21 | 1 | 75 | 75 | Fair |
| Example 21 | 2 | 75 | 70 | Good |
| Example 22 | 3 | 76 | 70 | Good |
| Example 23 | 3.3 | 77 | 65 | Excellent |
| Example 24 | 5 | 78 | 60 | Excellent |
| Example 25 | 7 | 80 | 50 | Excellent |
| Example 26 | 8 | 82 | 40 | Excellent |
| Example 27 | 10 | 85 | 35 | Good |
| Example 28 | 15 | 90 | 30 | Good |
| Example 29 | 20 | 100 | 20 | Good |
| Reference Example 22 | 25 | 150 | 10 | Fair |

As shown in Table 5, the conductive sheet stacks 12 of Reference Examples 21 and 22 had low detection sensitivities. In Reference Example 21, the second conductive patterns 18B had a high surface resistance of 75 ohm/sq, and it was likely that the second conductive patterns 18B could not reduce the noise impact of the electromagnetic wave. In Reference Example 22, though the second conductive patterns 18B had a significantly low surface resistance, the first conductive patterns 18A had a high surface resistance of 150 ohm/sq. It was likely that the detection sensitivity of the first electrodes 24A was deteriorated due to the high surface resistance.

In contrast, the conductive sheet stacks 12 of Examples 21 to 29 had high detection sensitivities. Particularly the conductive sheet stacks 12 of Examples 23 to 26 had excellent detection sensitivities.

Therefore, it is clear that the ratio of the occupation area A2 of the second conductive patterns 18B to the occupation area A1 of the first conductive patterns 18A preferably satisfies $1<A2/A1\leq20$, further preferably satisfies $1<A2/A1\leq10$, and particularly preferably satisfies $2\leq A2/A1\leq10$.

It is to be understood that the conductive sheet and the touch panel of the present invention are not limited to the above embodiments, and various changes and modifications may be made therein without departing from the scope of the present invention.

The invention claimed is:

1. A conductive sheet comprising a plurality of conductive patterns arranged in one direction, wherein
    the conductive patterns each contain a combination of a plurality of first lattices and a plurality of second lattices, the first lattices and the second lattices are composed of thin metal wires that form a pattern of shapes, and the pattern of shapes of the second lattices are larger than the pattern of shapes of first lattices,
    second lattice portions containing the second lattices are arranged in the one direction,
    first lattice portions containing the first lattices are arranged at predetermined intervals in a direction approximately perpendicular to the one direction, and
    the first lattice portions are not connected with the second lattice portions.

2. The conductive sheet according to claim 1, wherein the first lattice portions each contain two or more first lattices arranged in the one direction.

3. The conductive sheet according to claim 1, wherein the first lattice portions each contain an L-shaped pattern containing a corner of the first lattices.

4. The conductive sheet according to claim 1, wherein the first lattice portions each contain a cross-shaped pattern containing a corner of the first lattices.

5. The conductive sheet according to claim 1, wherein the first lattices have a side length of 30 to 500 μm.

6. The conductive sheet according to claim 1, wherein the thin metal wires have a line width of 15 μm or less.

7. The conductive sheet according to claim 1, wherein a side length of the second lattice is a real-number multiple of the side length of the first lattice.

8. The conductive sheet according to claim 7, wherein the side length of the second lattice is twice as large as the side length of the first lattice.

9. A conductive sheet comprising a plurality of conductive patterns arranged in one direction, wherein
the conductive patterns each contain a combination of a plurality of first lattices and a plurality of second lattices, the first lattices and the second lattices are composed of thin metal wires that form a pattern of shapes, and the pattern of shapes of the second lattices are larger than the pattern of shapes of first lattices,
first lattice portions containing the first lattices and second lattice portions containing the second lattices are electrically connected and alternately arranged in a direction approximately perpendicular to the one direction, and
a length of the first lattice portion is approximately equal to a length of the second lattice portion in the one direction.

10. The conductive sheet according to claim 9, wherein the length L1 of the first lattice portion and the length L2 of the second lattice portion in the direction approximately perpendicular to the one direction satisfy an inequality of L2<L2.

11. The conductive sheet according to claim 10, wherein the lengths L1 and L2 satisfy an inequality of $1.5 \times L1 \leq L2 \leq 6 \times L1$.

12. The conductive sheet according to claim 9, wherein the length L1 of the first lattice portion and the length L2 of the second lattice portion in the direction approximately perpendicular to the one direction satisfy an inequality of L1>L2.

13. The conductive sheet according to claim 12, wherein the lengths L1 and L2 satisfy an inequality of $1.5 \times L2 \leq L1 \leq 6 \times L2$.

14. The conductive sheet according to claim 9, wherein the first lattices have a side length of 30 to 500 μm.

15. The conductive sheet according to claim 9, wherein the thin metal wires have a line width of 15 μm or less.

16. The conductive sheet according to claim 9, wherein a side length of the second lattice is a real-number multiple of the side length of the first lattice.

17. The conductive sheet according to claim 16, wherein the side length of the second lattice is twice as large as the side length of the first lattice.

18. A conductive sheet comprising a first conductive part and a second conductive part overlapping with each other, wherein
the first conductive part contains a plurality of first conductive patterns arranged in one direction,
the second conductive part contains a plurality of second conductive patterns arranged in another direction perpendicular to the one arrangement direction of the first conductive patterns,
the first conductive patterns and the second conductive patterns each contain a combination of a plurality of first lattices and a plurality of second lattices, the first lattices and the second lattices are composed of thin metal wires, and the second lattices are larger than the first lattices,
in the first conductive patterns, portions overlapping with the second conductive patterns each contain a plurality of the second lattices, and portions not overlapping with the second conductive patterns each contain a plurality of the first lattices,
in the second conductive patterns, portions overlapping with the first conductive patterns each contain a plurality of the second lattices, and portions not overlapping with the first conductive patterns each contain a plurality of the first lattices, and
the overlaps of the first conductive patterns and the second conductive patterns each contain a combination of a plurality of the first lattices as viewed from above.

19. The conductive sheet according to claim 18, wherein
the first conductive patterns and the second conductive patterns each have a strip shape, and
a maximum width of the second conductive pattern is larger than that of the first conductive pattern.

20. The conductive sheet according to claim 19, wherein the ratio (Wb/Wa) of the maximum width Wb of the second conductive pattern to the maximum width Wa of the first conductive pattern satisfies a condition of $1 < Wb/Wa \leq 10$.

21. The conductive sheet according to claim 19, wherein the ratio (Wb/Wa) of the maximum width Wb of the second conductive pattern to the maximum width Wa of the first conductive pattern satisfies a condition of $2 \leq Wb/Wa \leq 8$.

22. The conductive sheet according to claim 19, wherein the ratio (Wb/Wa) of the maximum width Wb of the second conductive pattern to the maximum width Wa of the first conductive pattern satisfies a condition of $3 \leq Wb/Wa \leq 5$.

23. The conductive sheet according to claim 18, wherein an occupation area of the second conductive patterns is larger than that of the first conductive patterns.

24. The conductive sheet according to claim 23, wherein when the first conductive patterns have an occupation area A1 and the second conductive patterns have an occupation area A2, the conductive sheet satisfies a condition of $1 < A2/A1 \leq 20$.

25. The conductive sheet according to claim 23, wherein when the first conductive patterns have an occupation area A1 and the second conductive patterns have an occupation area A2, the conductive sheet satisfies a condition of $1 < A2/A1 \leq 10$.

26. The conductive sheet according to claim 23, wherein when the first conductive patterns have an occupation area A1 and the second conductive patterns have an occupation area A2, the conductive sheet satisfies a condition of $2 \leq A2/A1 \leq 10$.

27. The conductive sheet according to claim 18, wherein
in the first conductive patterns, the portions containing a plurality of the first lattices act as first electrodes,
in the second conductive patterns, the portions containing a plurality of the first lattices act as second electrodes, and
the first electrodes, the second electrodes, and the overlaps of the first conductive patterns and the second conductive patterns form a uniform lattice pattern as viewed from above.

28. The conductive sheet according to claim 18, wherein
the first conductive part contains first auxiliary patterns between adjacent first conductive patterns, and the first auxiliary patterns are not connected to the first conductive patterns,
the second conductive part contains second auxiliary patterns between adjacent second conductive patterns, and the second auxiliary patterns are not connected to the second conductive patterns, and
as viewed from above, the first auxiliary patterns and the second auxiliary patterns overlap with each other to form combined patterns, and the combined patterns each contain a combination of a plurality of the first lattices.

29. The conductive sheet according to claim 18, wherein the first lattices have a side length of 30 to 500 μm.

30. The conductive sheet according to claim 18, wherein the thin metal wires have a line width of 15 μm or less.

31. The conductive sheet according to claim 18, wherein the first conductive part and the second conductive part are stacked with a substrate interposed therebetween, and the substrate has a thickness of 50 to 350 μm.

32. The conductive sheet according to claim 18, wherein a side length of the second lattice is a real-number multiple of the side length of the first lattice.

33. The conductive sheet according to claim 32, wherein the side length of the second lattice is twice as large as the side length of the first lattice.

34. A touch panel comprising a conductive sheet, which is used on a display panel of a display device, wherein
the conductive sheet contains a plurality of conductive patterns arranged in one direction,
the conductive patterns each contain a combination of a plurality of first lattices and a plurality of second lattices, the first lattices and the second lattices are composed of thin metal wires that form a pattern of shapes, and the pattern of shapes of the second lattices are larger than the pattern of shapes of first lattices,
second lattice portions containing the second lattices are arranged in the one direction,
first lattice portions containing the first lattices are arranged at predetermined intervals in a direction approximately perpendicular to the one direction, and
the first lattice portions are not connected with the second lattice portions.

35. A touch panel comprising a conductive sheet, which is used on a display panel of a display device, wherein
the conductive sheet contains a plurality of conductive patterns arranged in one direction,
the conductive patterns each contain a combination of a plurality of first lattices and a plurality of second lattices, the first lattices and the second lattices are composed of thin metal wires that form a pattern of shapes, and the pattern of shapes of the second lattices are larger than the pattern of shapes of first lattices,
first lattice portions containing the first lattices and second lattice portions containing the second lattices are electrically connected and alternately arranged in a direction approximately perpendicular to the one direction, and
the length of the first lattice portion is approximately equal to the length of the second lattice portion in the one direction.

36. A touch panel comprising a conductive sheet, which is used on a display panel of a display device, wherein
the conductive sheet contains a first conductive part disposed closer to an input operation surface and a second conductive part disposed closer to the display panel,
the first conductive part and the second conductive part overlap with each other,
the first conductive part contains a plurality of first conductive patterns arranged in one direction,
the second conductive part contains a plurality of second conductive patterns arranged in another direction perpendicular to the one arrangement direction of the first conductive patterns,
the first conductive patterns and the second conductive patterns each contain a combination of a plurality of first lattices and a plurality of second lattices, the first lattices and the second lattices are composed of thin metal wires, and the second lattices are larger than the first lattices,
in the first conductive patterns, portions overlapping with the second conductive patterns each contain a plurality of the second lattices, and portions not overlapping with the second conductive patterns each contain a plurality of the first lattices,
in the second conductive patterns, portions overlapping with the first conductive patterns each contain a plurality of the second lattices, and portions not overlapping with the first conductive patterns each contain a plurality of the first lattices, and
the overlaps of the first conductive patterns and the second conductive patterns each contain a combination of a plurality of the first lattices as viewed from above.

* * * * *